(12) United States Patent
Nolte et al.

(10) Patent No.: US 8,886,295 B2
(45) Date of Patent: Nov. 11, 2014

(54) METHOD AND APPARATUS FOR MOTILITY CONTRAST IMAGING

(75) Inventors: David D. Nolte, Lafayette, IN (US); John J. Turek, West Lafayette, IN (US); Kwan Jeong, Seoul (KR)

(73) Assignee: Purdue Research Foundation, West Lafayette, IN (US)

( * ) Notice: Subject to any disclaimer, the term of this patent is extended or adjusted under 35 U.S.C. 154(b) by 121 days.

(21) Appl. No.: 12/874,855

(22) Filed: Sep. 2, 2010

(65) Prior Publication Data
US 2010/0331672 A1 Dec. 30, 2010

Related U.S. Application Data

(63) Continuation of application No. PCT/US2009/036124, filed on Mar. 5, 2009.

(60) Provisional application No. 61/034,028, filed on Mar. 5, 2008.

(51) Int. Cl.
| | |
|---|---|
| *G01B 9/02* | (2006.01) |
| *G03H 1/08* | (2006.01) |
| *G03H 1/04* | (2006.01) |

(52) U.S. Cl.
CPC ............... *G03H 1/08* (2013.01); *G03H 1/0443* (2013.01); *G03H 2210/62* (2013.01); *G03H 2001/0445* (2013.01); *G03H 2001/045* (2013.01); *G03H 2222/33* (2013.01); *G03H 2223/20* (2013.01); *G03H 2001/0467* (2013.01)
USPC ............................ 600/476; 600/473; 356/450

(58) Field of Classification Search
USPC ................... 600/473, 476; 356/450
See application file for complete search history.

(56) References Cited

U.S. PATENT DOCUMENTS

| | | | |
|---|---|---|---|
| 4,674,824 A | 6/1987 | Goodman et al. | |
| 5,682,262 A | 10/1997 | Wefers et al. | |
| 6,195,168 B1 | 2/2001 | De Lega et al. | |
| 6,262,818 B1 | 7/2001 | Cuche et al. | |
| 6,556,305 B1 * | 4/2003 | Aziz et al. | 356/512 |
| 7,057,720 B2 * | 6/2006 | Caracci et al. | 356/300 |
| 7,148,970 B2 | 12/2006 | de Boer | |

(Continued)

OTHER PUBLICATIONS

Jeong et al., "Fourier Domain digital holographic optical coherence imaging of living tissue", Optical Society of America, 2007, 4999-5008.*

(Continued)

*Primary Examiner* — Christopher Cook
(74) *Attorney, Agent, or Firm* — Maginot, Moore & Beck, LLP

(57) ABSTRACT

A system for motility contrast imaging a biological target within tissue comprising a CCD array; an illumination source for generating an incoming beam; a first beam splitter for receiving the incoming beam and producing an object beam and a reference beam; a second beam splitter for illuminating a multitude of biological targets with the object beam and for directing backscattered object beams towards the CCD array; a computer-controlled delay stage for zero-path-matching the reference beam to the backscattered object beams; a reference beam that intersects the backscattered object beams at an angle to produce a series of interference fringes that modulate Fourier-domain information; and a computer for receiving a time series of Fourier-domain information. The interference fringes between the backscattered object beam and the reference beam are recorded by the CCD array and passed to the computer which constructs a digital hologram at successive times.

11 Claims, 20 Drawing Sheets

(56) References Cited

U.S. PATENT DOCUMENTS

| | | | |
|---|---|---|---|
| 7,452,681 B2* | 11/2008 | Amaral et al. | 435/7.1 |
| 2004/0101168 A1* | 5/2004 | Kostrzewski et al. | 382/115 |
| 2006/0243831 A1* | 11/2006 | Gonzalez-Zugasti et al. | 241/23 |
| 2008/0277595 A1* | 11/2008 | Lundquist et al. | 250/458.1 |
| 2009/0018436 A1* | 1/2009 | Gey Van Pittius et al. | 600/425 |
| 2010/0027857 A1* | 2/2010 | Wang | 382/128 |

OTHER PUBLICATIONS

Jeong et al., "Fourier-domain holographic optical coherence imaging of tumor spheroids and mose eye", Applied Optics, vol. 44, No. 10, 2005.*

Jeong et al., "Functional Imaging by Dynamic Speckle in Digital Holographic Optical Coherence Imaging", published online Feb. 7, 2007, Proc. of SPIE, vol. 6429.*

Jeong et al., "Digital Holographic Optical Coherence Imaging of Tumor Tissue", 2006, Proc. of SPIE, vol. 6079.*

Jeong, Kwan, "Holographic Optical Coherence Imaging of Living Tissue", 2007, Proquest Publishing, pp. 1-205.*

Jeong, Kwan, "Holographic Optical Coherence Imaging of Living Tissue", Jan. 2007, Purdue University.*

Jeong et al., "Functional Imaging by Dynamic Speckle in Digital Holographic Optical Coherence Imaging", published online Feb. 7, 2007, Proc. of SPIE, vol. 6429, citation.*

Biester, "Plate::vision—The System of Many Talents", Innovation 12, 2002, pp. 1-2.*

Jeong, K., et al., Fourier-domain holography in photorefractive quantam-well films. Applied Optics, 2004. 43(19): p. 3802-3811.

K. Jeong, J. J. Turek, and D. D. Nolte, "Imaging Motility Contrast in Digital Holography of Tissue Responses to Cytoskeletal Anti-cancer Drugs," Optics Express, vol. 15, pp. 14.

Nolte, D. et al., Cellular motility as a novel contrast agent in digital holography of tissue, SPIE—The International Society for Optical Engineering, 2007, p. 1-2.

Yu, P., et al., Time-Dependent Speckle in Holographic Optical Coherence Imaging and the State of Health of Tumor Tissue. Opt. Lett., 2004. 29(1): p. 68-70.

PCT/US2009/035124, Written Opinion.

Fujimoto, J. G., Optical coherence tomography for ultrahigh resolution in vivo imaging. Nature Biotechnology, 2003. 21(11): p. 1361-1367.

Fercher, A.F., et al., Optical coherence tomography—principles and applications. Reports on Progress in Physics, 2003. 66(2): p. 239-303.

Hyde, S.C.W., et al., Depth-resolved holography through turbid media using photorefraction. IEEE J. Sel. Top. Quant. Electron., 1996. 2: p. 965.

Jones, R., et al., Holographc storage and high background imaging using photorefractive multiple quantum wells. Appl. Phys. Lett., 1996. 69: p. 1837.

Jones, R., et al., Real-time 3-D holographic imaging using photorefractive media including multiple-quantum-well devices. IEEE J. Sal. Top Quant. Electron., 1998.4(2):p. 360-9.

Tziraki, M., et al., Photorefractive Holography for Imaging through turbid media using low coherence light. Appl. Phys. B, 2000. 70: p. 151.

Nolte, D.D., Semi-insulating semiconductor heterostructures: Optoelectronic properties and applications. J. Appl. Phys., 1999. 85: p. 6259.

Nolte, D.D., et al., Adaptive Beam Combining and Interferometer usin Photorefractive Quantum Wells. J. Opt. Soc, Am. B, 2001. 18: p. 195-205.

Jeong, K., et al., Fourier-domain holographic optical coherence imaging of tumor spheroids and mouse eye. Appl. Opt., 2005. 44(10): p. 1798-1806.

Yu, P., et al., Holographic optical coherence imaging of rat osteogenic sarcoma tumor spheroids. Applied Optics, 2004. 43(25): p. 4862-4873.

Poon, T.C., T. Yatagai, and W. Juptner, Digital holography—coherent optics of the 21st century: Introduction. Applied Optics, 2006. 45(5): p. 821-821.

Schnars, U. and W.P.O. Juptner, Digital recording and numerical reconstruction of holograms. Measurement Science & Technology, 2002. 13(9): p. R85-R101.

De Ridder, L., Autologous confrontation of brain tumor derived spheroids with human dermal spheroids. Anticancer Res., 1997. 17: p. 4119-4120.

Groebe, K. and W. Mueller-Klieser, On the relation between size of necrosis and diameter of tumor spheroids, Int. J. Radiat. Oncol. Biol. Phys., 1996. 34: p. 395-401.

Hamamoto, R., et al., Differentiation and proliferation of primary rat hepatocytes cultured as spheroids. J. Biochem.(Tokyo) 1998. 124 p. 972-979.

Hamilton, G., Multicellular spheroids as an in vitro tumor model. Cancer Lett., 1998. 131: p. 29-34.

Hargrave, P., et al., Optical properties of multicellular tumour spheroids. Phys.Med.Biol., 1996. 41: p. 1067-1072.

Kunz-Schughart, L.A., M. Kreutz, and R. Knuechel., Multicellular spheroids:a three-dimensional in vitro culture system to study tumour biology.Int.J.Exp. Pathol., 1998.79:p.1-23.

Kunz-Schughart, L.A., Multicellular tumor spheroids: intermediates between monolayer culture and in vivo tumor. Cell Biology International, 1999. 23(3): p. 157-161.

Mueller-Klieser, W., Biophys. J., 1984. 46: p. 343-348.

Freyer, P., et al., Cancer Research, 1991. 51: p. 3831-383.

Mueller-Klieser, W., Am. J. Physiol., 1997(273): p. 1109-1123.

Vale, R.D., The molecular motor toolbox for intracellular transport. Cell, 2003. 112(4): p. 467-480.

Vale, R.D. and R.A. Milligan, The way things move: Looking under the hood of molecular motor proteins. Science, 2000. 288(5463): p. 88-95.

Karsenti, E. and I. Vernos, Cell cycle—The mitotic spindle: A self-made machine. Science, 2001. 29(5542): p. 543-547.

Hirokawa, N., Kinesin and dynein superfamily proteins and the mechanism of organelle transport. Science, 1998. 279(5350): p. 519-526.

Desai, A. and T.J. Mitchison, Microtubale polymerization dynamics. Annual Review of Cell and Developmental Biology, 1997. 13: p. 83-117.

Peterson, J.R. and T.J. Mitchison, Small molocules, big impact: A history of chemical inhibitors and the cytoskeleton. Chemistry & Biology, 2002. 9(12): p. 1275-1285.

Jordan, M.A. and L. Wilson, Microtubes and actin filaments: dynamic targets for cancer chemotherapy. Current Opinion in Cell Biology, 1998. 10(1): p. 121-130.

Pollard, T.D. and G.G. Borisy, Cellular motility driver by assembly and disassembly of actin filaments. Cell,2003. 112(4): p. 453-465.

Cukierman, E., et al., Taking cell-matrix adhesions to the third dimension. Science, 2001, 294(5547): p. 1708-1712.

Webb, D.J. and A.F. Horwitz, New dimensions in cell migration. Nat Cell Biol, 2003. 5(8): p. 690.

Moerner, W.E. and D.P. Fromm, Methods of single-molecule fluorescence spectrocopy and microscopy. Review of Scientific Instruments, 2003. 74(8): p. 3597-3619.

Webb, R.H., Confocal optical microscopy. Reports on Progress in Physics, 1996. 59(3): p. 427-471.

Cahalan, M.D., at al., Two-photon tissue imaging: Seeing the immune system in a fresh light. Nature Reviews Immunology, 2002. 2(11): p. 872-880.

Konig, K., Multiphoton microscopy in life sciences. Journal of Microscopy-Oxford, 2000. 200: p. 83-104.

Sharpe, J., et al., Optical projection tomography as a tool for 3D microscopy and gene expression studies. Science, 2002. 296(5567): p. 541-545.

Huisken, J., et al., Optical sectioning deep inside live embryos by selective plane illumination microscopy. Science, 2004. 305(5686): p. 1007-1009.

Gustafsson, M.G.L., Nonlinear structured-illumination microscopy: Wide-field fluorescence imaging with theoretically unlimited resolution. Proceedings of The National Academy 2005.

(56) References Cited

OTHER PUBLICATIONS

Klar, T.A., et al., Fluorescence microscopy with diffraction resolution barrier broken by stimulated emission. Proceedings of The National Academy of Sciences of The United St 2000.

Cailleau, R.M., et al., Breast tumor cell lines from pleural effusions. J. Natl. Cancer Inst., 1974. 53: p. 661-674.

Kaighn, M.E., Establishment and characterization of a human prostatic carcinoma cell line (PC-3). Invest. Urol., 1979. 17: p. 16-23.

Knowles, B.B., Human hepatocellular carcinoma cell lines secrete the major plasma proteins and hepatitis B surface antigen. Science, 1980. 209: p. 497-499.

Lee, G.Y., et al., Three-dimensional culture models of normal and malignant breast epithelial cells. Nat Methods, 2007. 4: p. 359-65.

Kuz-Schughart, L.A., et al., The use of 3-D cultures for high-throughput screening: The multicellular spheroid model. Journal of Biomolecular Screening, 2004. 9(4): p. 273-28.

Walenta, S., et al., Metabolic Imaging in Multicellular Spheroids of Oncogene-transfected Fibroblasts. J. Histochemistry and Cytochemistry, 2000. 48: p. 509-522.

Jackson, J.R., et al., Targeted anti-mitotic therapies: can we improve on tubulin agents? Nature Reviews Cancer, 2007. 7(2): p. 107-117.

Schmitt, J.M., Optical coherence tomography (OCT): A review. IEEE Journal of Selected Topics in Quantum Electronics, 1999. 5(4): p. 1205-1215.

Hyde, S.C.W., et al., Sub-100 Micron Depth-Resolved Holographic Imaging Through Scattering Media in the Near-Infared. Optics Letters. 1995. 20(22): p. 2330-2332.

\* cited by examiner

METHOD AND APPARATUS FOR MOTILITY CONTRAST IMAGING

RELATED APPLICATIONS

This application is a continuation application of and claims priority to PCT Application Serial No. PCT/US2009/036124 filed 5 Mar. 2009 (International Publication Number WO 2009/111609), and further claims priority to U.S. Provisional Patent Application Ser. No. 61/034,028 filed 5 Mar. 2008, the disclosures of which are expressly incorporated by reference herein.

GOVERNMENT SUPPORT

The invention was made with government support under Grant No. 0401858 awarded by the US National Science Foundation (NSF). The US Government has certain rights in the invention.

FIELD OF THE INVENTION

The present teachings relate generally to the microscopic imaging of cellular motion, and specifically to the use of motility contrast imaging techniques to image biological targets within tissues.

BACKGROUND AND SUMMARY OF THE INVENTION

Motility contrast imaging is a coherence-domain imaging technique that uses wide-field illumination and is multimodal in operation, particularly as the technique allows the simultaneous illumination of a large number of diffraction-limited areas. Unlike imaging operations performed in accordance with single-mode optical coherence tomography (OCT), motility contrast imaging allows internal motion of living tissue to be extracted as a function of three-dimensional location.

Motility contrast imaging is an extension of holographic optical coherence imaging (HOCI). Optical coherence imaging (OCI) was originally developed by French and Nolte using adaptive optical films. OCI images were taken of living tissue, and later enhancements significantly improved the sensitivity and penetration depth. OCI included speckle-reduction elements (vibrating mirrors and diffusers) with time-averaging to remove speckle to allow imaging of structures. However, it was also discovered that the highly active dynamic speckle in living tissue vanished in dead or chemically-fixed tissue.

The speckle-reduction elements were removed to study this dynamic speckle in living tissue directly. This change in emphasis prompted a migration of the detection technology to conventional CCD cameras using digital holography, particularly to detect sub-cellular motion inside tissue with high sensitivity. Digital holography is less complex and requires no sophisticated nonlinear optical elements.

Motility contrast imaging (MCI) uses fully-developed speckle fields that carry little structural information. More particularly, MCI identifies the separate contributions of different types of sub-cellular motion to measured dynamic speckle, which enables the development of an endogenous multi-functional imaging method based on the different signatures from the different functions of intracellular motion. To provide these fully-developed speckle fields, multimode illumination by low-coherence light is used. This is in sharp contrast to OCT, which seeks to eliminate speckle to achieve the highest possible spatial resolution. The speckle-fields of MCI arise from the interference of multiple scatterers with random phases within a coherence volume inside the tissue. The holographic coherence gate localizes the detected motion to within a thin slab inside the tissue with a thickness determined by the coherence length of the laser. Using this approach, nanoscale motion has been sensed as deep as 1 mm inside tissue localized to within 30 micron volumes (voxel size corresponding to the spatial resolution) across a field of view of 1 mm. MCI presents an unexpected imaging approach based on motility as the contrast agent.

One of the many possible applications of MCI is to image the effects of the largest class of anti-cancer drugs—i.e., the anti-mitotic drugs that arrest cellular motion associated with mitosis. The many different forms of intracellular motion contribute separately to the measured dynamic speckle. With the present invention it is possible to unravel these different contributions by using selected drugs that arrest different types of motion. To test these drugs, multicellular tumor spheroids are used, which are three-dimensional tissue structures that reproduce in vivo pharmacological responses with all the advantages of being in vitro. Many possible tissue targets can be investigated with this invention, including three-dimensional tissue models of specific cancers as well as connective tissue models that closely mimic the extracellular matrix.

According to a first aspect of the present invention, a system for motility contrast imaging a biological target within tissue is provided. The system comprises a CCD array located at a Fourier plane; an illumination source for generating an incoming beam; a first beam splitter for receiving the incoming beam and producing an object beam and a reference beam; a second beam splitter for causing the object beam to illuminate the biological target and for directing a backscattered object beam towards the CCD array; a computer-controlled delay stage for zero-path-matching the reference beam to the backscattered object beam; a reference beam intersects the backscattered object beam at an angle to produce a series of interference fringes that modulate Fourier-domain information; and a computer for receiving a time sequence of Fourier-domain information. The interference fringes between the backscattered object beam and the reference beam are recorded by the CCD array and passed to the computer which constructs a digital hologram at successive times.

According to another aspect of the present invention, a system for motility contrast imaging of multiple biological targets is provided. The system comprises a multi-well plate having a plurality of wells, each well containing a biological target; a CCD array located at a Fourier plane; an illumination source for generating incoming beams; a first beam splitter for receiving the incoming beams and producing a multitude of object beams that illuminate the biological target; a microlens array for directing a backscattered object beam towards the CCD array; a computer-controlled delay stage for zero-path-matching the reference beam to the backscattered object beam; a reference beam that intersects the backscattered object beam at an angle to produce a series of interference fringes that modulate Fourier-domain information; and a computer for receiving the Fourier-domain information. The interference fringes between the backscattered object beam and the reference beam are recorded by the CCD array and passed to the computer which constructs a digital hologram of the first portion of the plurality of wells that contain biological targets.

In accordance with yet another aspect of the present invention, a method for motility contrast imaging biological targets within tissues is provided. The method comprises generating an incoming beam with an illumination source; receiving the incoming beam with a first polarizing beam splitter to produce an object beam a reference beam; causing the object beam to illuminate the biological target; directing a backscattered object beam towards the CCD array; zero-path-matching the reference beam to the backscattered object beam; intersecting the reference beam with the backscattered object beam at an angle to produce a series of interference fringes that modulate Fourier-domain information; recording the interference fringes between the backscattered object beam and the reference beam; and using the Fourier-domain information to construct a digital hologram of a first portion of a plurality of wells containing the biological targets.

BRIEF DESCRIPTION OF DRAWINGS

The above-mentioned aspects of the present teachings and the manner of obtaining them will become more apparent and the teachings will be better understood by reference to the following description of the embodiments taken in conjunction with the accompanying drawings, wherein.

DETAILED DESCRIPTION

The embodiments of the present teachings described below are not intended to be exhaustive or to limit the teachings to the precise forms disclosed in the following detailed description. Rather, the embodiments are chosen and described so that others skilled in the art may appreciate and understand the principles and practices of the present invention.

Figure 1:
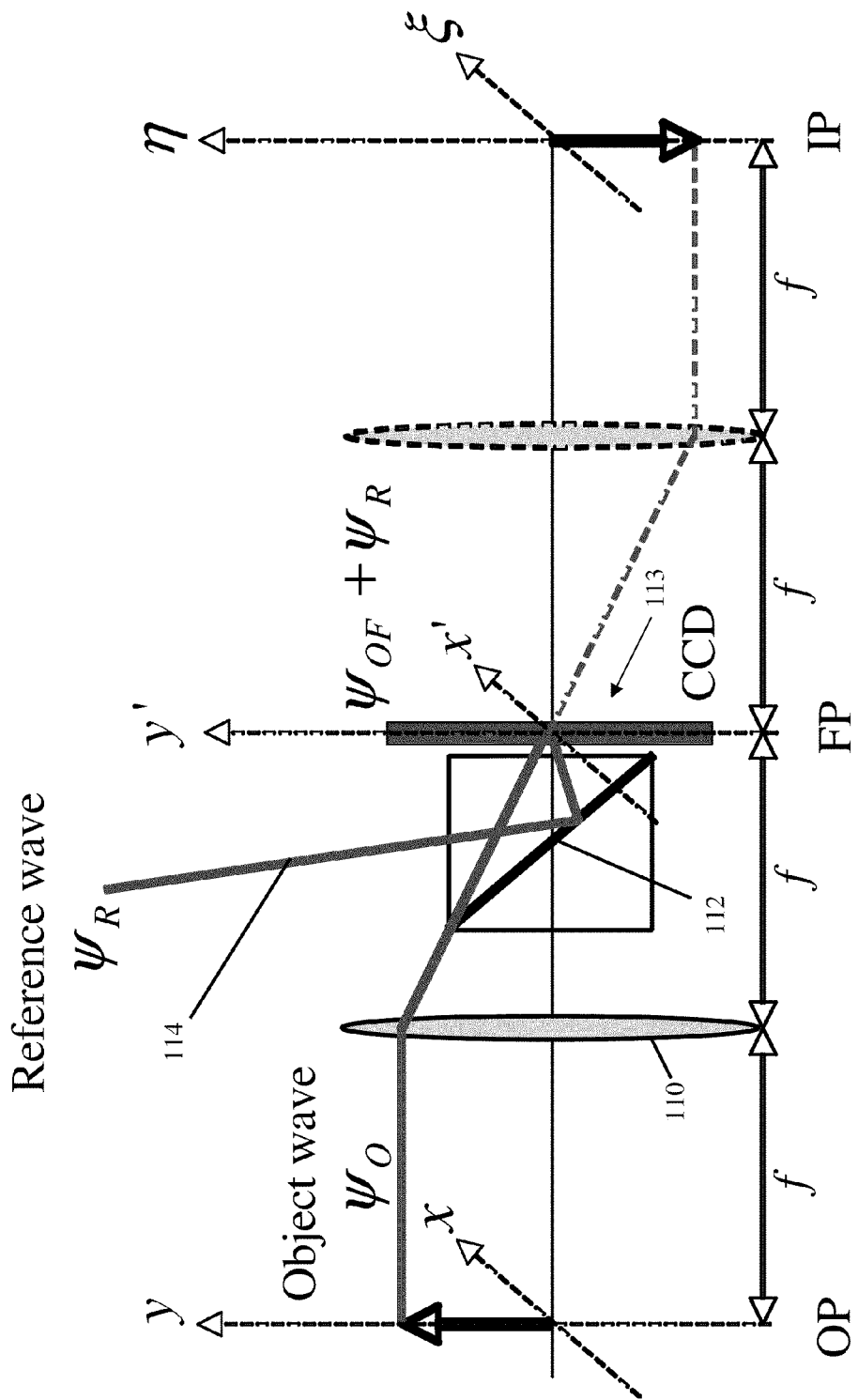
FIG. 1 depicts one embodiment of an optical imaging configuration for Fourier-domain digital holography (FDDH) in accordance with the teachings of the present invention.

An illustrative embodiment depicting an optical imaging configuration for Fourier-domain digital holography (FDDH) is shown in FIG. 1. This embodiment is useful for imaging a biological target within a tissue sample and includes a Fourier transform lens 110, a beamsplitter 112 and a CCD array 113, where f is the focal length of the lens; $\Psi_O$ is the object wave at the object plane (OP); $\Psi_{OF}$ is the object wave at the Fourier plane (FP); $\Psi_R$ is a reference wave; and the image plane is generated by a numerical transform (FFT) that demodulates the digital hologram. The biological target is located at the object plane and transformed through the Fourier transform lens 110 to the Fourier plane, where the CCD array 113 is located. The reference wave 114 is incident on the beamsplitter 112, and intersects the signal wave at an angle to produce a series of interference fringes that modulate the Fourier-domain information. The Fourier-domain hologram from the CCD is downloaded to a computer and transformed using a simple fast Fourier transform algorithm (FFT).

Figure 2:
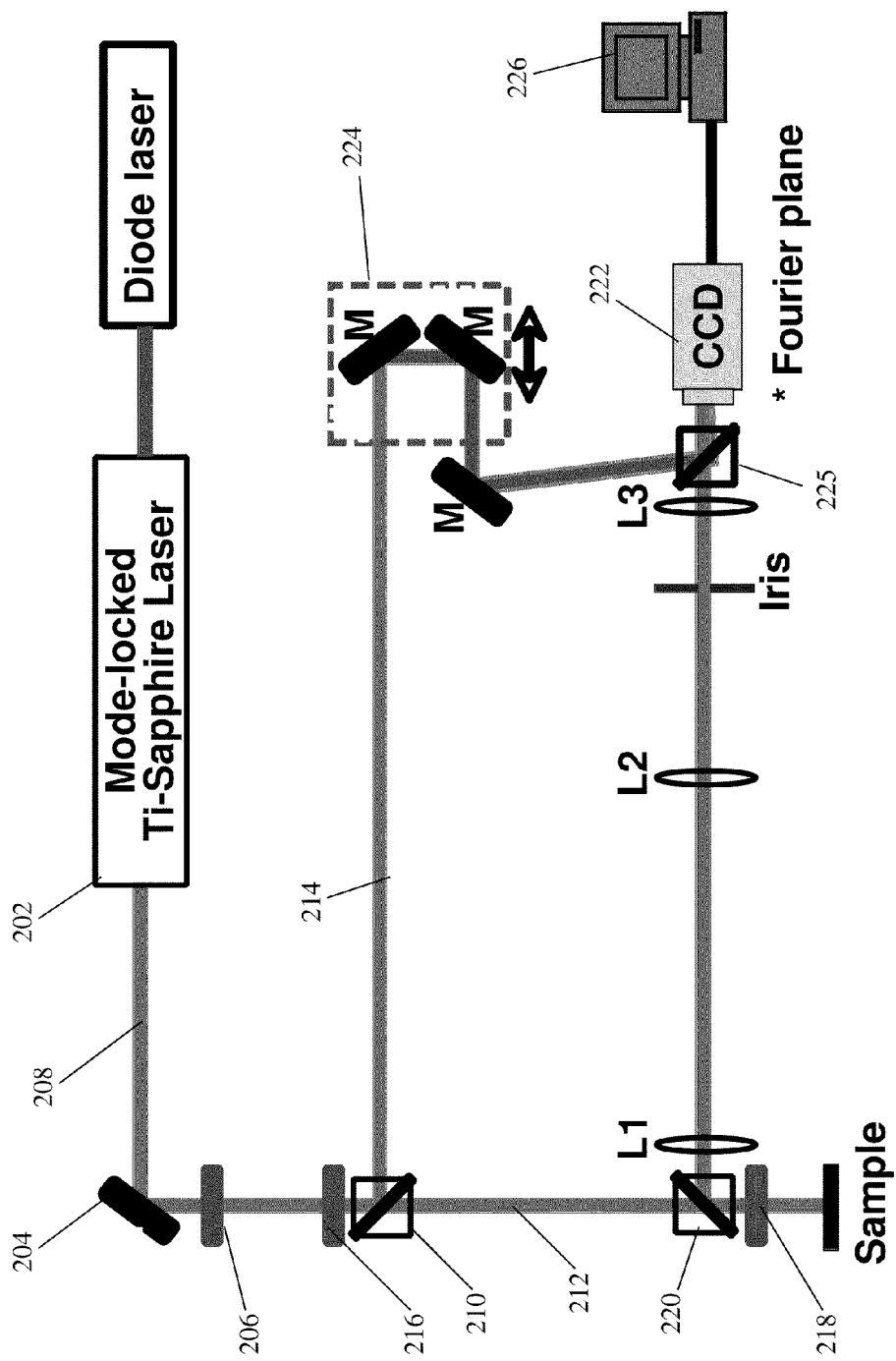
FIG. 2 is a schematic depicting an experimental set-up in accordance with the teachings of the present invention and used to record and reconstruct digital holograms for FDDH.

An exemplary schematic depicting an experimental set-up that can be used to record and reconstruct digital holograms for FDDH in accordance with the teachings of the present invention is shown in FIG. 2. In certain embodiments, the experimental set-up includes a short-coherence light source and an imaging Mach-Zehnder interferometer. The short-coherence light source can be an ultrafast laser, a superluminescent diode (e.g., a superluminescent diode having a center wavelength of approximately 840 nm and a bandwidth of approximately 50 nm) or any other appropriately broadband light source. In FIG. 2, a mode-locked Ti:sapphire laser 202, having a 100 femtosecond (fs) pulse duration, 100 MHz repetition rate is shown. The center wavelength of the laser 202 is 840 nm with a bandwidth of 17 nm. After encountering a mirror 204 and neutral density filter 206, the output beam 208 passes through an initial polarizing beam splitter 210 to produce an object beam 212 with a vertical polarization and a reference beam 214 with a horizontal polarization. The neutral density filter 206 and half-wave (λ/2) plate 216 are used to control the incoming beam intensity and the beam ratio of the object beam 212 to the reference beam 214. In addition, a quarter-wave (λ/4) plate 218 is placed behind a second polarizing beam splitter 220 to ensure that the backscattered object beam has horizontal polarization after returning through the quarter-wave plate. After the backscattered object beam passes the second polarizing beam splitter 220, the object beam is relayed with a 1:1 magnification by lenses L1 and L2 (with a focal length of 15 cm). Lens L3 (with a focal length of 4.8 cm) performs the Fourier transform of the object beam located at the CCD camera 222, where it interferes with the zero-path-matched reference beam that passes through the computer-controlled delay stage 224. A third beam splitter 225 is located at the Fourier plane where the reference beam intersects the backscattered object beam at an angle to produce a series of interference fringes that modulate Fourier-domain information. The delay stage at the object plane is used to place the CCD camera 222 at the Fourier plane of the object. The fringe spacing is adjusted to be three times the size of a pixel. The interference fringes between the object beam and the reference beam are recorded by the CCD camera 222 and the computer 226. Digital holograms are reconstructed by the FFT. The illustrative object intensity for living tissue at the object plane in accordance with the teachings of the present invention is about 6 mW/mm$^2$ and a 12-bit CCD camera with one mega-pixel resolution is used with an exposure time of 10 msec.

Multicellular spheroids of normal cells or neoplastic cells (tumor spheroids) are balls of cells that may be easily cultured up to 1 mm in size in vitro. The spheroids can be used to simulate the optical properties of a variety of tissues such as the epidermis and various epithelial tissues and may be used to simulate the histological and metabolic features of small nodular tumors in the early avascular stages of growth. Three dimensional aggregates of permanent cell lines offer a reliable model for systematic study of tumor response to therapy. In vitro monitoring of tissue response to drugs is an area of strong interest to pharmaceutical companies. Although the in vitro environment is artificial, the biochemistry, metabolism and cell signaling response of cells grown as 3D constructs closely simulates in vivo tissue. Therefore, in vitro experiments are a validated (and inexpensive) surrogate for in vivo response.

Figure 3:
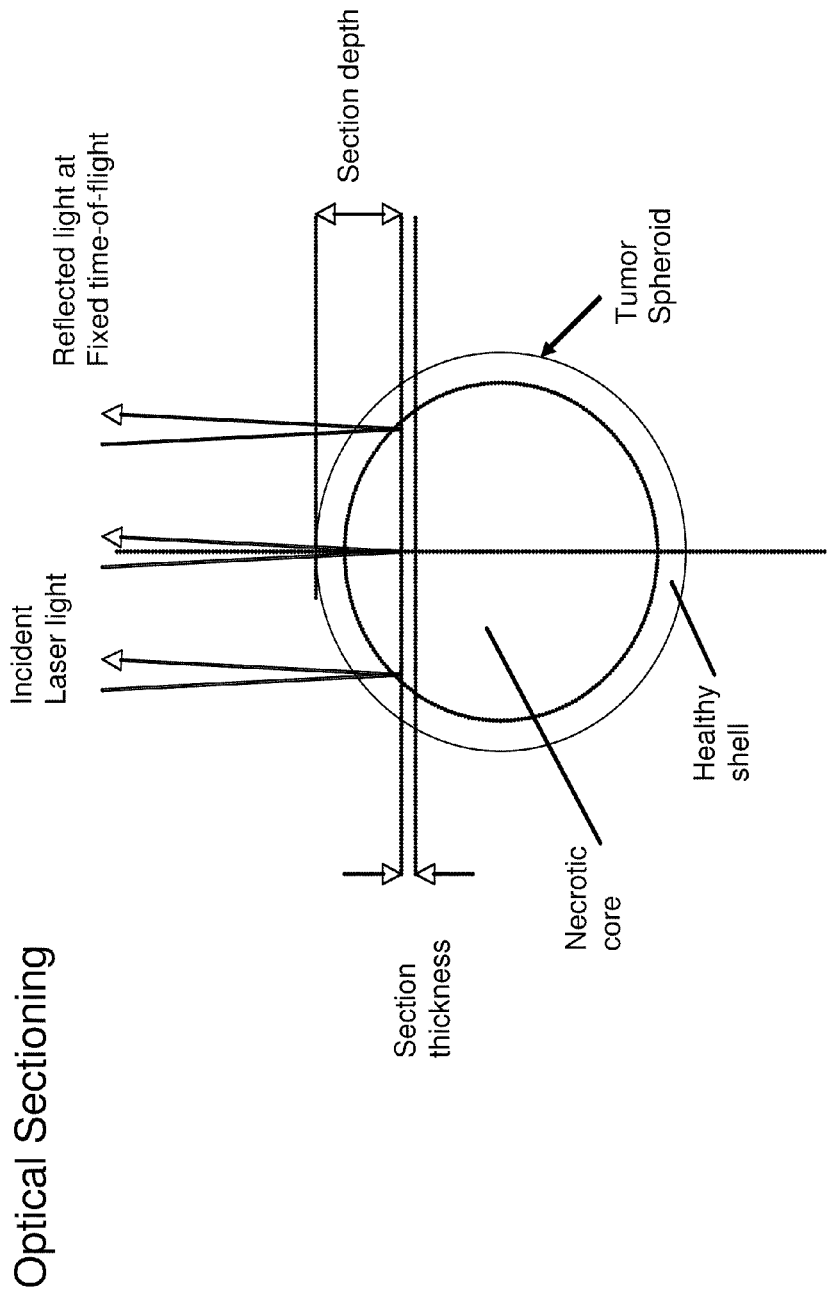
FIG. 3 is a schematic depicting the ability of holographic optical coherence imaging (OCI) in accordance with the teachings of the present invention to extract an optical section from a fixed depth inside tissue.

FIG. 3 is a schematic depicting holographic optical coherence imaging (OCI) in accordance with the teachings of the present invention and using holography to extract an optical section from a fixed depth inside tissue. The technique may be thought as based on time-of-flight, which is similar to the principles of radar. More technically, the detection uses a coherence gate that selects light from a defined depth inside the tissue. The holography discards the incoherent background of scattered light, which can be up to a million times brighter, and records only image-bearing light. Motility contrast imaging (MCI) goes one step further by recording the multiple interferences (laser speckle) of the light scattered from organelles inside the cell. The dynamic behavior of the speckle correlates with cellular and sub-cellular motility that correlates with metabolic activity or cytoskeleton function. In this way, motility information buried up to 1 mm deep in tissue can be measured and used to track the time course of metabolic or cytoskeletal changes of tissue in response to pharmaceuticals. Beyond a critical size (about 100 microns) most spheroids develop a necrotic core surrounded by a shell of viable, proliferating cells, with a thickness varying from about 100 to about 300 µm. The development of necrosis has been linked to deficiencies in the metabolites related to energy generation and transfer. The limiting factor for necrosis development is oxygen—i.e., the oxygen consumption and oxygen transport reflecting the status of the spheroid. Early work on spheroids launched the study of therapeutic strategies for cancer, especially the spheroid response to different drugs. The response to drug therapy was quantified from an analysis of spheroid volume growth delay, increase in the necrotic area, and change in survival capacity. This work focused on hypoxia and its induction by chemical agents. None of these studies considered cellular and sub-cellular motility as a diagnostic tool of cellular vitality, particularly because there were no means of detecting motility nondestructively throughout a volume. Motility contrast imaging provides this capability for the first time, and motility information has been obtained up to a millimeter deep in tumor spheroids.

Motion is the over-arching characteristic that distinguishes living from inanimate matter. The cellular machinery that drives motion consists of molecular motors and their molecular tracks known as the cytoskeleton. The cytoskeleton is composed of three types of filaments: microtubules, actin and intermediate filaments. Of these, the best studied and understood are the microtubules and actin. Microtubules form interconnected pathways that span the cytosol that provide molecular highways for organelles carried by molecular motors like kinesin and dynein. The smaller actin filaments form a tight mesh called the cell cortex concentrated mostly near the cell membrane, but with lower densities throughout the cytosol. The actin skeleton lends mechanical stability to the cell membrane and allows its motion, including the crawling of metastatic cancer cells through tissue.

The most active use of the cytoskeletal machinery occurs during mitosis in which the entire cellular structure is reorganized prior to and during division. During mitosis, the microtubules form the mitotic spindle which is an organized mechanical structure that helps divide the intracellular contents for cell division. Actin plays an important role in cytokinesis at the end of mitosis when the cell membrane pinches off, and the cell physically divides. For these reasons, drugs that inhibit the motors and their tracks are common anti-cancer agents, arresting the cell cycle by arresting motion.

The largest class of anti-cancer therapeutic agents is known as anti-mitotic drugs (AMD), also called cytoskeletal drugs. These drugs affect the cellular cytoskeleton and prevent cells from entering the mitosis phase of the cell cycle. Some of the best known anti-cancer drugs (such as Taxol and Colchicine) fall in this class. Although efficacious, these drugs have serious toxic side effects because their action is non-specific as they affect the cytoskeleton of healthy cells and cancer cells alike. Morbidity and death from the side effects of chemotherapy rival the death rates from the disease itself. Therefore, a modern generation of anti-mitotic agents are being investigated that act specifically on cells actively dividing, yet do not interfere with interphase cells. Some of these drugs act on certain myosin molecular motors that only function during mitosis and are quiescent otherwise. Others act on proteins of the signaling pathways that constitute the mitotic checkpoints of the cell cycle. By turning off selected molecular signals with these drugs, the cell cycle is arrested, and cancer cells do not proliferate.

Microscopic imaging of cellular motility and motility-related gene expression is well-established in two dimensions. However, cells in contact with flat hard surfaces do not behave the same as cells embedded in the extracellular matrix. Recent work has raised the dimensionality of cellular motility imaging from 2D to 3D, including microscopes such as confocal fluorescence, two-photon, optical projection tomography (OPT), and single-plane illumination projection (SPIM). Lateral resolution in these cases is diffraction-limited at the surface of the 3D matrix but degrades the deeper the sectioned images penetrate into the target sample. Although structured illumination and stimulated emission approaches can beat that limit under special circumstances, these methods also suffer significant degradation in resolution with increasing probe depth, limiting access to motility information from deep inside the sample where it is far from the artificial influence of surfaces.

Cells deep within tissue may not be accessible to standard probes, such as confocal microscopy or two-photon microscopy, but they are accessible using MCI. Three-dimensional motility assays using MCI applied to three-dimensional tissues retains the relevant molecular signaling of in vivo tissue but with the advantages of working in vitro. This can be used for tissue-based drug screening on cytoskeletal and anti-mitotic drugs that directly influence motility in the cell.

Motility contrast imaging is a functional optical imaging approach that uses cellular motility as a contrast agent to image (in three-dimensions) motion up to about 1 mm in depth inside living tissue samples. The technique is based on digital off-axis holography with coherence-domain gating that provides the volume sectioning. Multicellular tumor spheroids can be used to test the technique. The tumor spheroids have a well-defined morphology with proliferating cells in an outer shell surrounding a necrotic core. The speckle images of the tumor spheroids shimmer due to cellular motility, and statistical properties of the dynamic speckle are obtained by capturing temporally fluctuating images at successive depths.

Figure 4A:
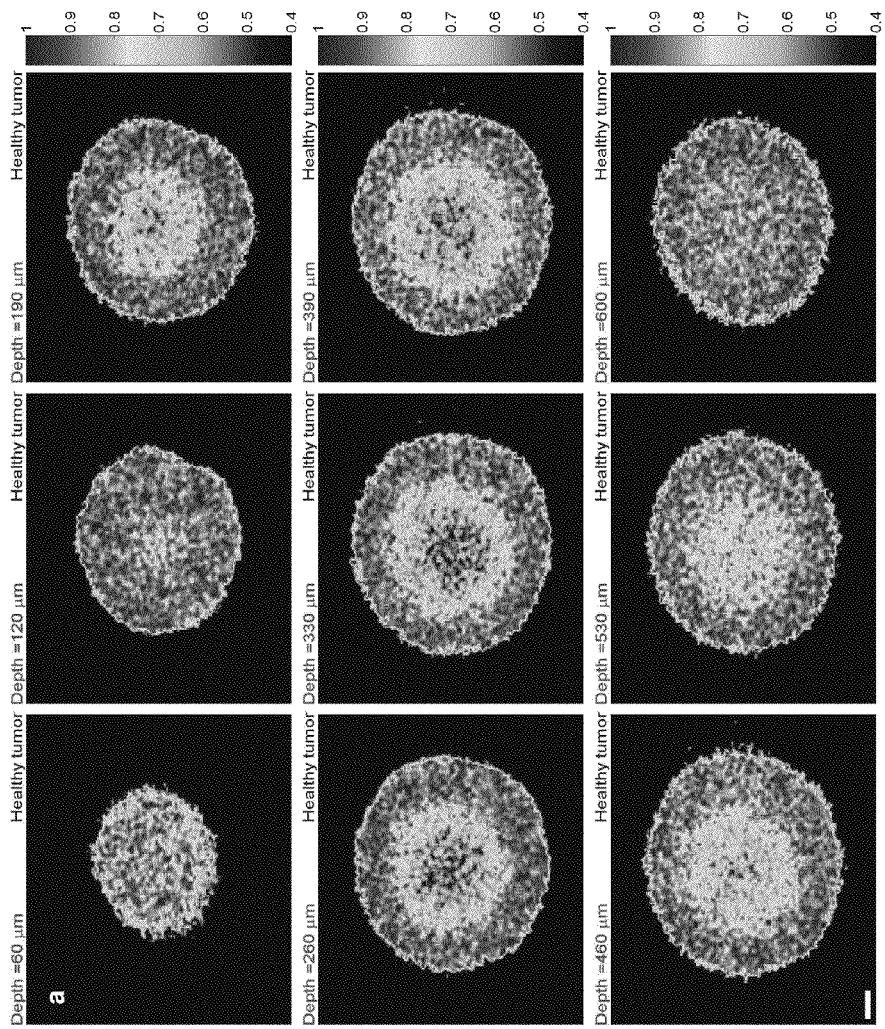
FIG. 4A depicts illustrative motility images captured in accordance with the teachings of the present invention and generated at nine different depths for a healthy tumor having a diameter of 680 mm.
Figure 4B:
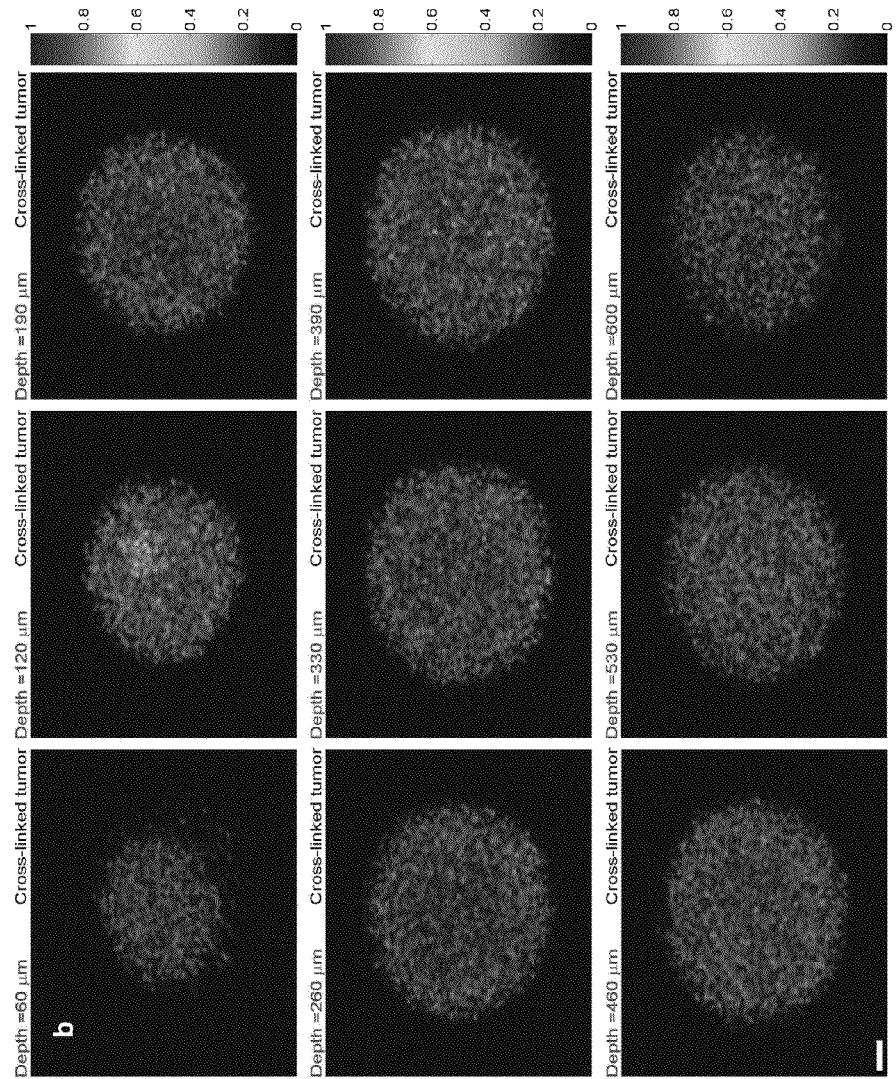
FIG. 4B depicts illustrative motility images captured in accordance with the teachings of the present invention and generated at nine different depths for a crosslinked tumor having a diameter of 680 mm.

The motility of the tissue in the proliferating/viable shell and the necrotic core are quantified using a statistical approach, such as a motility metric statistical approach, which is based on the normalized standard deviation (NSD) per pixel at fixed depth (i.e., the standard deviation divided by the average intensity). Large fluctuations in the dynamic speckle images result in a high NSD value, and so a two-dimensional (2-D) map of the NSD values gives a visual measure of motility. An example of motility images at selected depths in accordance with the teachings of the present invention is shown in false color in FIGS. 4A and 4B. More particularly, FIG. 4A shows motility maps generated at nine different depths (i.e., 60, 120, 190, 260, 330, 390, 460, 530 and 600 μm from the tumor top) for a healthy tumor having a diameter of 680 mm, while FIG. 4B shows motility maps generated at nine different depths for a crosslinked tumor also having a diameter of 680 mm. The motility values are plotted on a log color scale. As used herein, a "healthy" tumor refers to a tumor that has been removed from a bioreactor and maintained in growth medium at room temperature for no more than about 24 hours. A "crosslinked" tumor, on the other hand, refers to a tumor that has had its proteins polymerized by the addition of a chemical, such as 3% phosphate-buffered glutaraldehyde.

In the motility maps of the healthy tumor (FIG. 4A), the region with low activity increases to the mid depth of the tumor and then decreases to the bottom of the tumor. The region of low activity is mainly centralized in the core of the tumor, corresponding to the necrotic core. The dynamic area with high NSD values (darker exterior shell of reds and oranges) lies in a shell around the perimeter with a thickness of about 100 to about 200 μm. This matches the known morphology of the tumor spheroid with a necrotic core and viable outer shell.

In the motility maps for the crosslinked tumor (FIG. 4B), the inactive area (blue area) having low NSD values were shown for the entire volume and at all depths throughout the spheroid because the cross-linked tumor had no activity. This demonstrates that the viable area with strong cellular motility can be distinguished from tissue with low activity through functional imaging using intrinsic motility as the contrast agent.

In certain exemplary experiments in accordance with the teachings of the present invention, the average NSD value for a crosslinked tumor was found to be about 0.3, which is lower than the average NSD value between about 0.5 and 0.6 for the necrotic volume of a healthy tumor. This difference is caused mainly by the shimmering shower-glass effect. In the healthy tumor, the necrotic volume is enveloped by the dynamic viable shell and so the light backscattered from the necrotic area shimmers by passing through the viable area, which causes an increase of the apparent NSD value for the necrotic area. However, the NSD value for the necrotic area is quantitatively lower than for the viable area that is typically above 0.6, which indicates that the motility difference between dynamic tissue and inactive tissue can be detected, even under the effects of the shimmering shower-glass effect.

Figure 5:
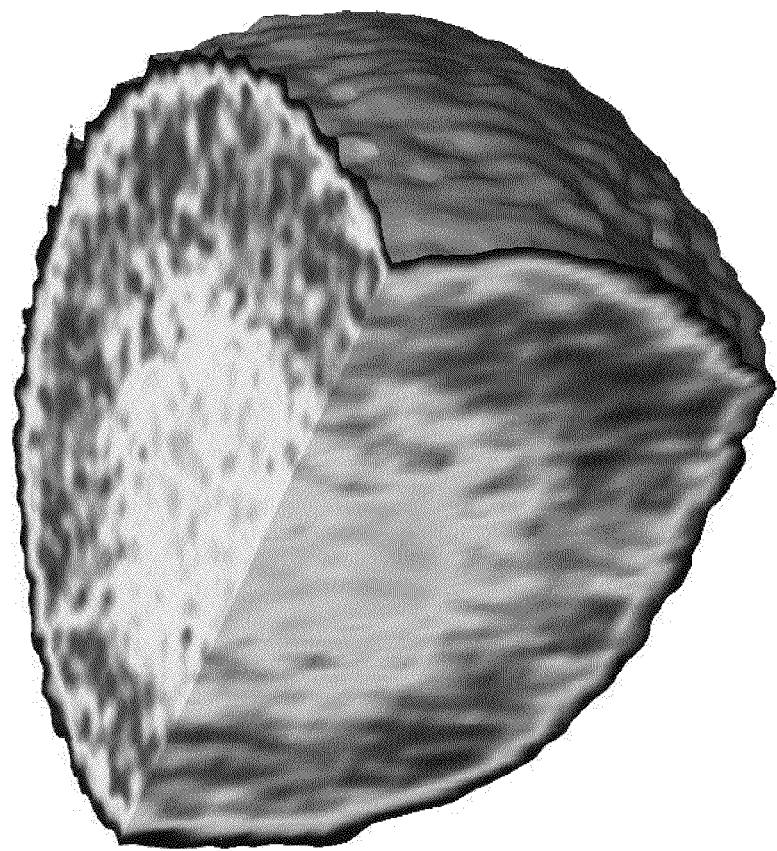
FIG. 5 depicts an exemplary volumetric motility image captured in accordance with the teachings of the present invention and created by stacking motility maps from successive depths.

By stacking the motility maps from successive depths, a volumetric motility image can be constructed. An illustrative three-dimensional (3D) visualization of a volumetric motility image of a tumor spheroid shown in cut-away perspective is depicted in FIG. 5. This illustrative tumor spheroid has a diameter of about 1 mm and depicts regions of high motility (reds and oranges (darker)) in the outer shell contrasted with regions of low motility (greens and blues (lighter)) in the necrotic core. This image clearly indicates active and inactive areas, and such high contrast is exceptionally sensitive to stimuli and assaults on the tumor that directly affect motion. Because of the cytoskeleton's essential role in cellular motility, it is possible to focus on tissue motility in response to certain anti-cancer drugs.

Advantages and improvements of the processes and methods of the present invention are demonstrated in the following descriptive embodiments. These embodiments are illustrative only and are not intended to limit or preclude other variants or aspects of the present invention.

According to one aspect of the present invention, functional imaging was conducted to track the cellular motility change in tissue in response to three cytoskeletal drugs: nocodazole, colchicine, and paclitaxel. Nocodazole and colchicine are anti-neoplastic drugs that disrupt microtubules by inhibiting polymerization of microtubules, while paclitaxel is an anti-neoplastic drug that stabilizes microtubules by preventing depolymerization. Before tracking drug response in a tumor spheroid, motility maps for the healthy tumor were generated for 10 minutes with a 1 minute time interval to obtain the healthy base-line. After the treatment of the spheroid with drugs, time-course measurements of the drug response were performed over three hours with 2-4 minute time intervals.

Figure 6:
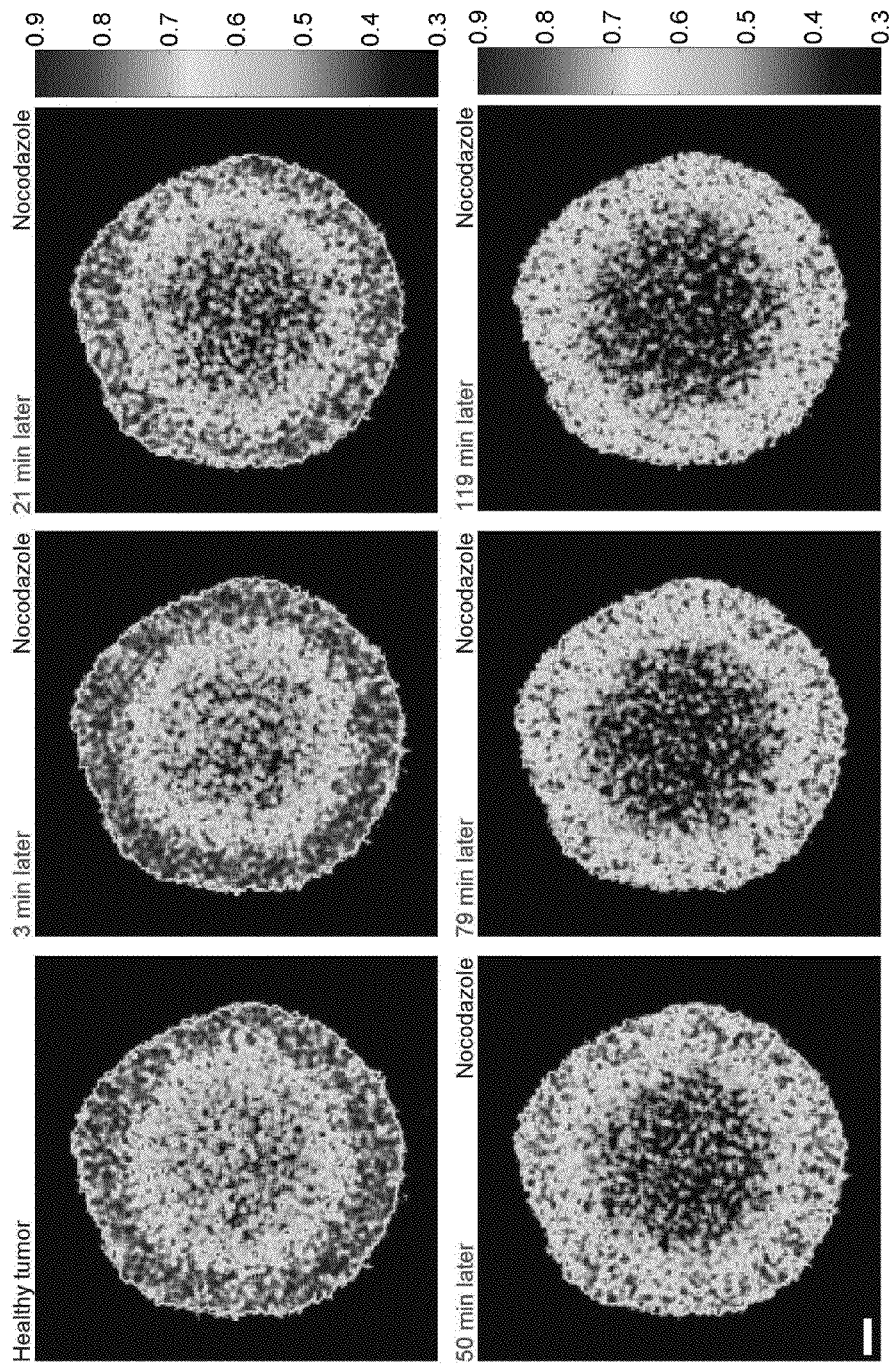
FIG. 6 depicts an imaged time response to the drug nocodazole using motility maps in accordance with the teachings of the present invention.

FIG. 6 shows an illustrative example of an imaged time response to the drug nocodazole using motility mapping in accordance with the present invention. The motility maps show the response of an 820-mm-diameter tumor, at a fixed depth of about 350 mm from the top of the tumor to 10 μg/ml nocodazole as a function of time. The first image (upper left) shows a healthy tumor, the remaining images show the tumor at 3 minutes, 21 minutes, 50 minutes, 79 minutes and 119 minutes, respectively, after treatment with the 10 μg/ml nocodazole. In the motility maps, NSD values in the outer shell decrease with time (lighten in grayscale images), which correlates with the inhibition of microtubule dynamics in viable cells. The white bar at lower left-hand section of the figure equals 100 μm. Time-course motility maps in response to 10 μg/ml colchicine treatment showed a similar trend to those for 10 μg/ml nocodazole treatment, but with a slower drug response.

Figure 7A:
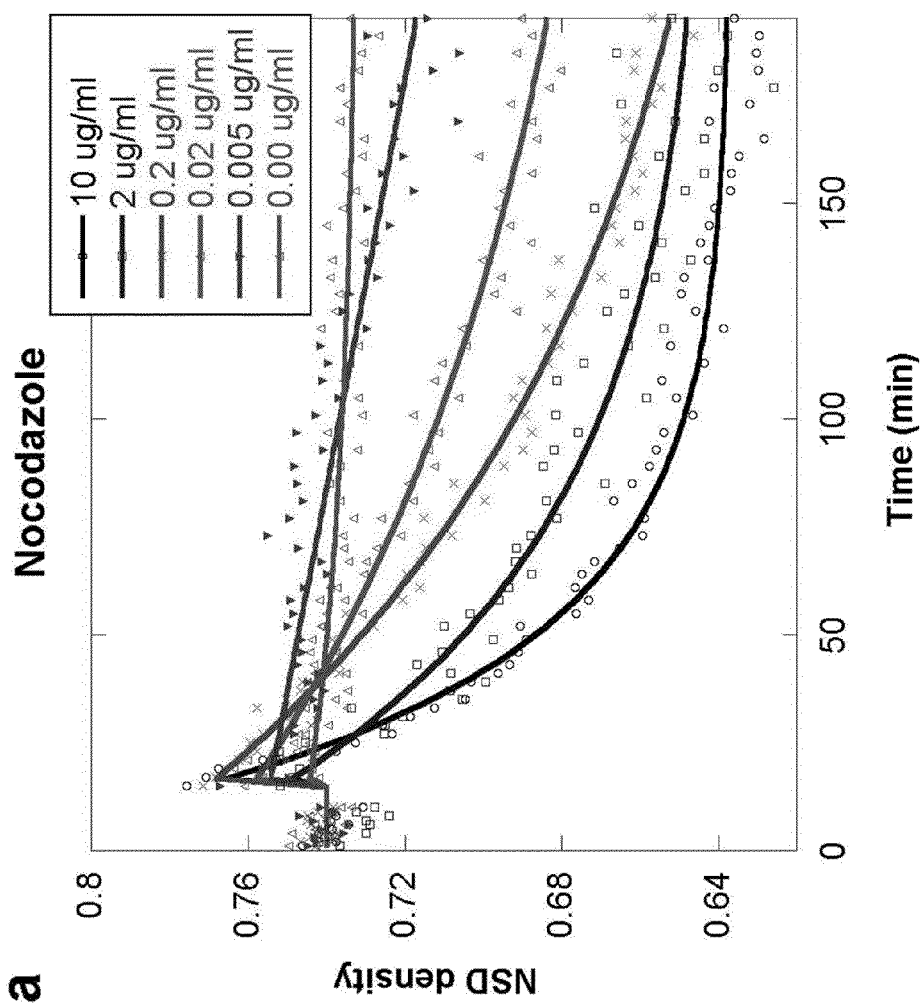
FIGS. 7a-7c depict graphical representations of time-course measurements of normalized standard deviation ("NSD") density as a function of dose for nocodazole, colchicine, and paclitaxel, respectively.
Figure 7B:
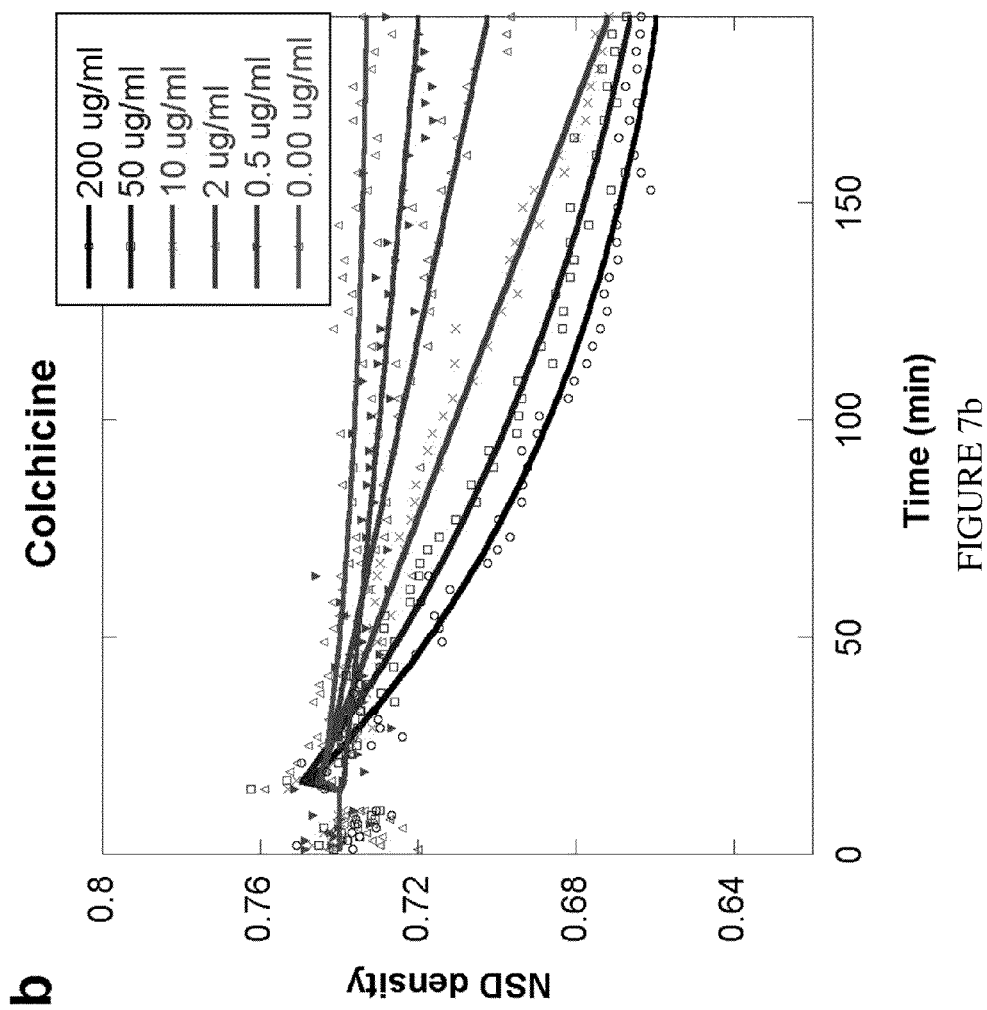
Figure 7C:
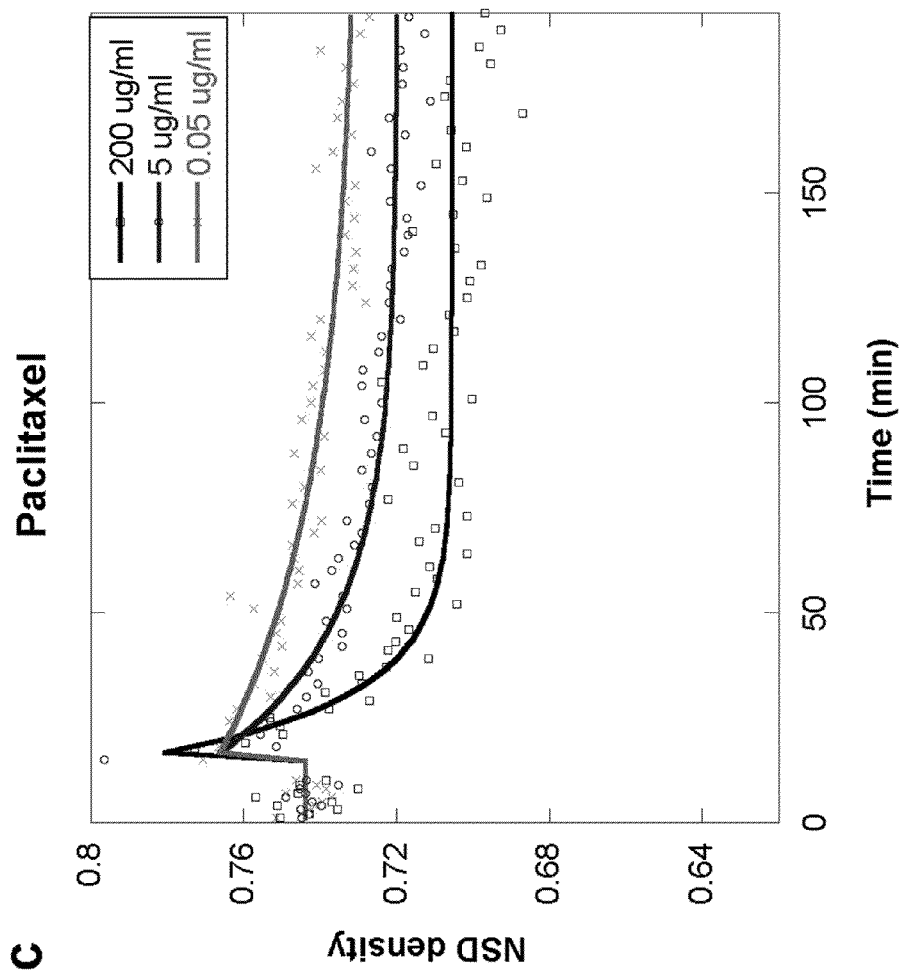

The time-course response of tissue to increasing drug concentrations establishes dose response curves. Graded concentrations of the cytoskeletal drugs nocodazole, colchicine and paclitaxel were added to the growth media of about 15 tumor spheroids. The motility response was measured at a fixed depth of about 350 mm (with tumor spheroids that ranged from 750 μm to 850 μm in diameter). The NSD density was obtained by the average of the NSD values only in the viable area. FIGS. 7A, 7B, and 7C show time-course measurements of NSD density (in the viable area) as a function of dose for nocodazole, colchicine, and paclitaxel, respectively. The measurements show dramatic motility decrease with increasing time and dose. In FIG. 7A, the lines at the right side of the graph from top to bottom correspond to treatment with 0.00, 0.005, 0.02, 0.2, 2 and 10 µg/ml nocodazole, respectively. In FIG. 7B, the lines at the right side of the graph from top to bottom correspond to treatment with 0.00, 0.5, 2, 10, 50 and 200 µg/ml colchicine, respectively. In FIG. 7C, the lines at the right side of the graph from top to bottom correspond to treatment with 0.05, 5, 50 and 200 µg/ml paclitaxel, respectively. The response of tissue to paclitaxel is small when compared to that of the other two drugs. This is because paclitaxel stabilizes the microtubules. To obtain the dose response curves, the data were fit using single-exponential decay.

Figure 7D:
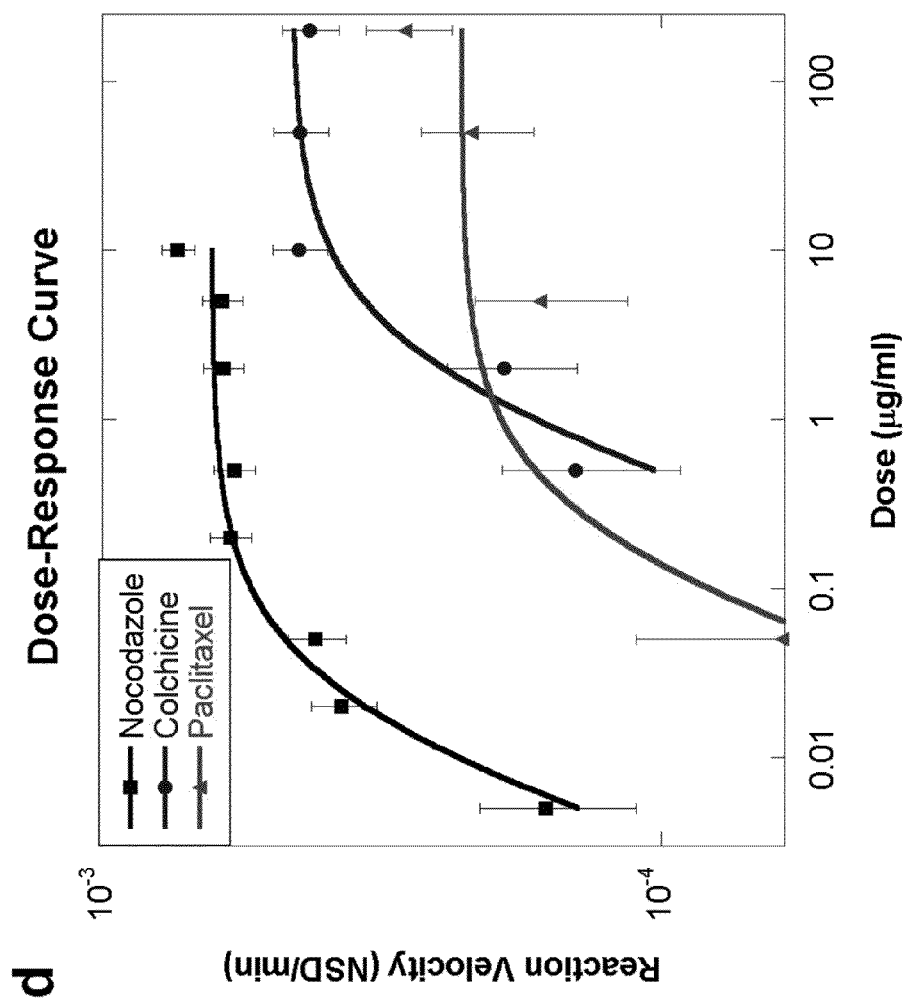
FIG. 7d depicts a graphical representation of dose-response curves for nocodazole, colchicine, and paclitaxel.

FIG. 7D shows the characteristic reaction velocities (NSD/min) dose-response curves of the three anti-neoplastic drugs, which are obtained from the characteristic time and magnitude of the time-response curves of NSD density in FIGS. 7A, 7B, and 7C, each fit to a first-order saturation curve. The upper curve is for nocodazole, the middle curve for colchicine, and the lower curve for paclitaxel. Nocodazole had an effective concentration for 50% response ($EC_{50}$) at 20 ng/ml compared to colchicine at 2 µg/ml and to paclitaxel at 100 ng/ml. Nocodazole had a saturated reaction velocity three times larger than that of paclitaxel. These dose-response curves may be viewed as the characteristic "fingerprints" of the effect of each drug on cellular motility.

An environmental chamber can be used in the MCI system to allow the study of fast motility rates related to organelles and enable the capture of transient response to drugs. The environmental chamber has a temperature control to allow experiments to be performed at biological temperatures. Temperature is also relevant for microtubule dynamics because low (room) temperature shifts the equilibrium of the tubulin polymerization reaction towards high free tubulin concentrations in cells and so can be used to control and study polymerization rates.

A continuous-flow-cell with multiple flow ports and fast switching between reservoirs makes it possible to introduce drugs under highly-controlled flow conditions, and to switch rapidly between one drug and another, or between a drug and growth medium. The rapid switching allows the study of on-times and off-reaction times for pharmacokinetics.

Figure 8:
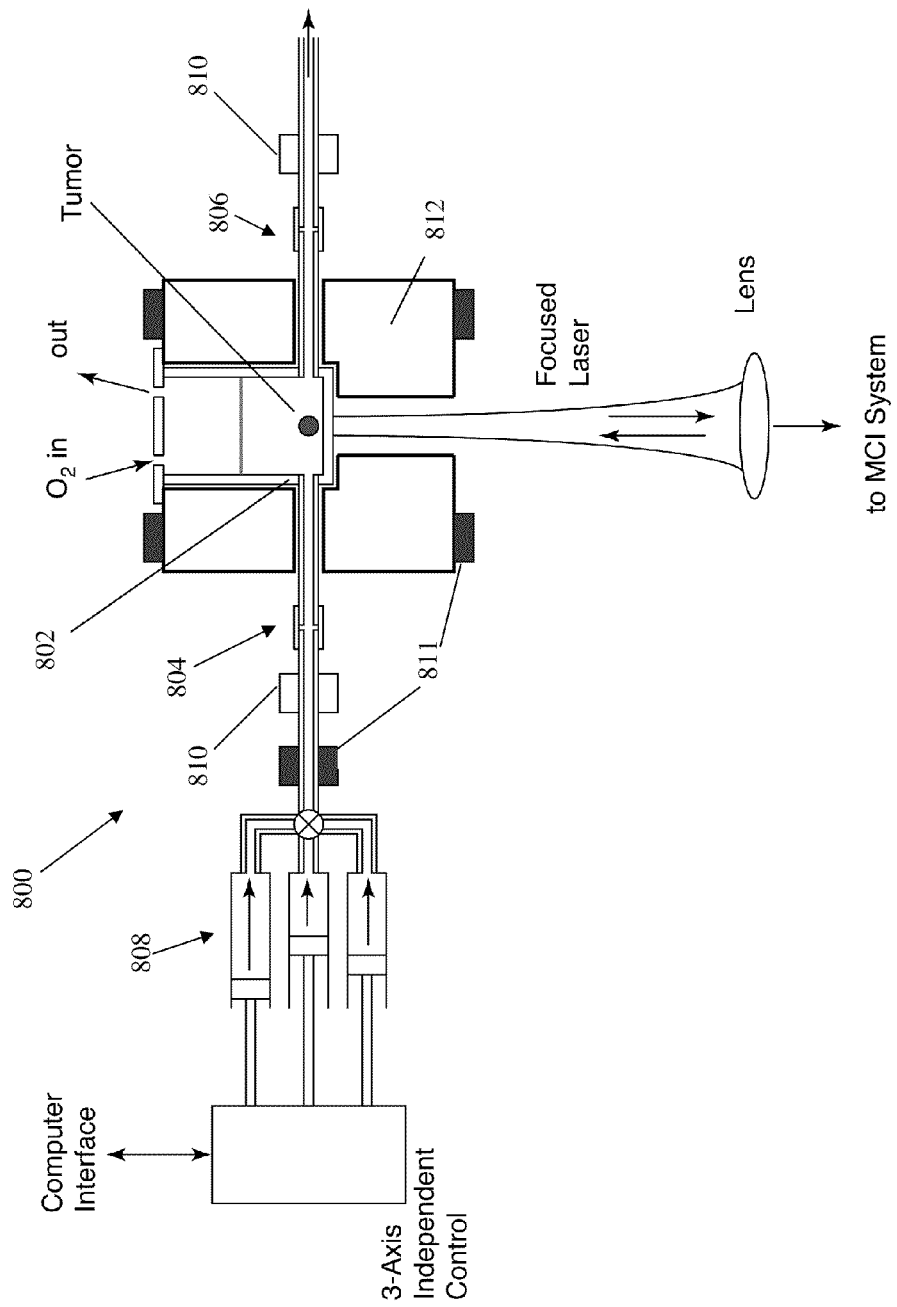
FIG. 8 depicts a schematic of an environmental system for use in accordance with the teachings of the present invention.

A schematic of an environmental sample testing chamber 800 (along with the optical access and the flow system), which can be used in accordance with the teachings of the present invention is shown in FIG. 8. The sample chamber 802 is an optical spectroscopic cuvette fitted with inlet and outlet ports (804, 806) for fluid flow. The top is closed, with ports for administering gases such as oxygen or $CO_2$ to study hypoxia. The flow control is a 3-axis computer-controlled syringe drive 808 on the inlet side 804, and the outlet 806 is open to atmospheric pressure. Thermoelectric heaters and coolers 810 provide the temperature adjustments, with thermocouples 811 at the inlet 804 and outlet 806, as well as inside the copper housing 812 to monitor the temperature in open loop. Closed-loop temperature control can be implemented if required. The optical cuvette is inside a copper housing with thermoelectric heaters/coolers and thermocouple readouts.

The cell line used for the tumor spheroid experiments is UMR-106 which is an immortalized rat osteogenic sarcoma cell line. Additional cell lines can be used to get a broader spectrum of tissue response to drugs. Other cell lines for tumor spheroids include the estrogen independent human mammary carcinoma cell line MDA-231, the human prostate carcinoma PC-3, and the human hepatocellular carcinoma Hep G2.

The system that transitions from 2D to 3D is discussed below. In addition, the growth of tumor spheroids and tissue on culture plates and also in 3D media such as collagen I gels or Matrigel is discussed. The cell lines can include human mammary epithelial cells (S1-normal phenotype and T4-metastatic phenotype). These cells have advantageous properties because the normal S1 cells form acinar structures when grown in Matrigel. The T4 cells, on the other hand, form cell clusters, much like tumor spheroids. The cell lines form these structures over a period of 10 days in culture so all stages of development can be imaged.

One embodiment of the MCI system uses a mode-locked Ti:Sapphire laser with 100 fsec pulse duration. Another embodiment uses a superluminescent diode having shorter coherence length down to 5 microns. The diode system could be an ultrastable LED which is engineered for very low-drift imaging applications.

A CCD camera is used with fast download having frame rates around 30 Hz, with faster cameras also available. A high-speed camera is useful for capturing a wide range of time scales and fast transients in response to applied drugs, as well as for separating the time scales of organelle transport relative to membrane motion. The separation of the time scales establishes specificity of motion to different functions and to different drugs. An exemplary camera system is a Cooke PCO1600, which has 30 fps for 1200×1600 pixels at 14-bit dynamic range. It has a full-well capacity of 40,000 electrons with 12 electron low-noise readout at 10 MHz. The 30 msec frame time enables the capture of fast dynamics, extending the time-scale range by an order of magnitude.

Speed can also enable the transition of MCI from in vitro to in vivo studies. With fast enough camera acquisition, it may be possible to perform MCI on living targets, including immobilized organisms and unconstrained organisms.

Different motility metrics can be used to define sub-cellular motion. One metric is the normalized standard deviation (NSD) for a given pixel. An alternative metric based on homodyne phase stabilization allows the measure of fluctuating phase contrast of a given pixel. The homodyne phase stabilization metric shows a reduction of the shimmering shower-glass effect (an additive contribution to the dynamic speckle caused by highly dynamic layers overlying layers of less active tissue). This metric also shows higher motility contrast than the NSD metric.

Multi-well plates can be used to enable high-throughput screening. Tumor spheroids grown in the bioreactor are transferred to wells in a plate and allowed to attach. In a high-throughput mode, each well is exposed to a different drug, and many tumors can be monitored in parallel. In this embodiment many wells are illuminated and imaged simultaneously onto the CCD camera.

Figure 9:
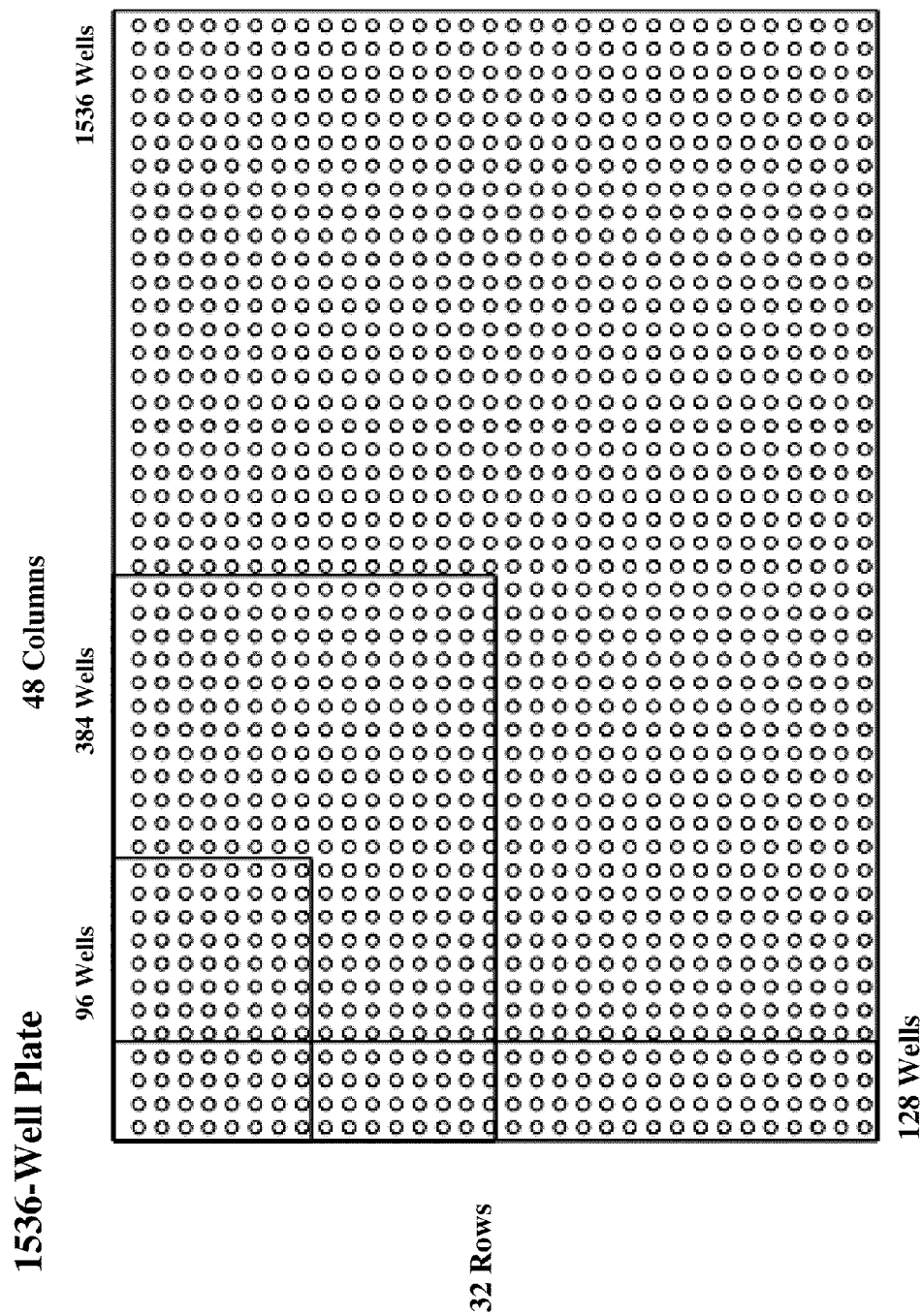
FIG. 9 depicts a 1536-well plate layout for use in accordance with the teachings of the present invention.
Figure 10:
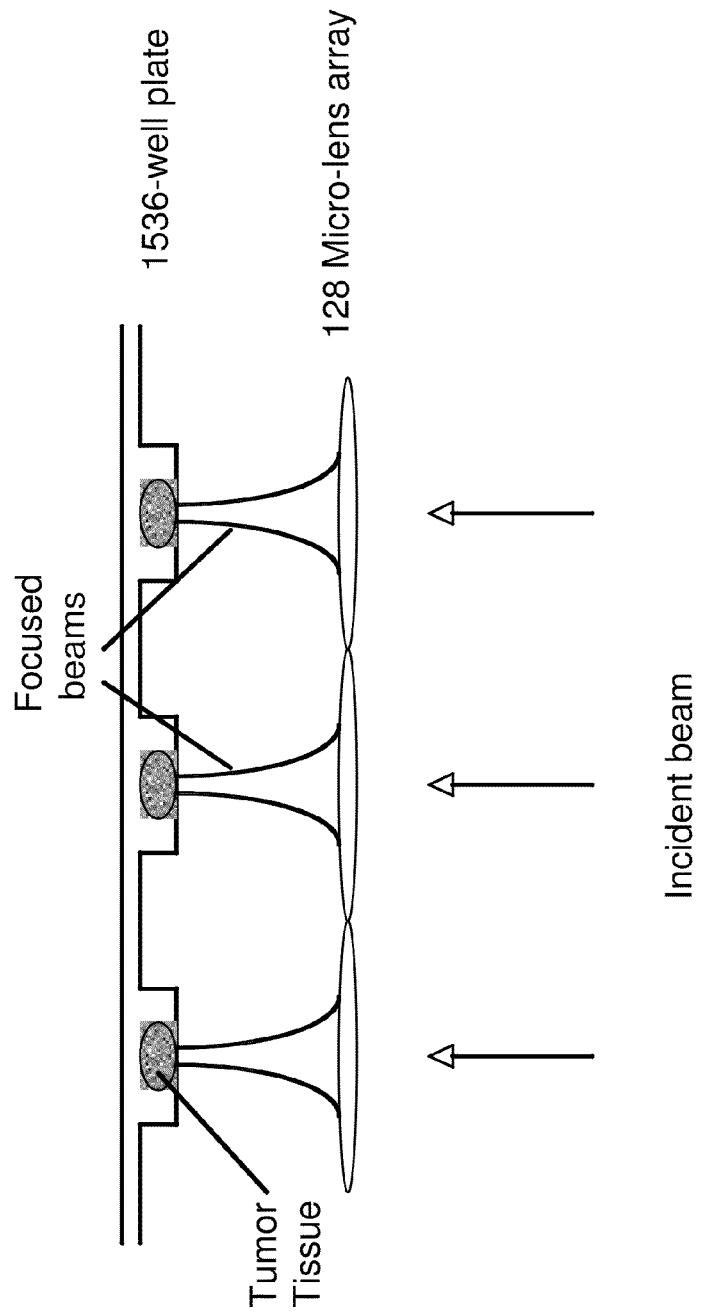
FIG. 10 depicts the imaging of a 1536-well plate onto a CCD camera through a micro-lens array with 128 molded-plastic lenses concentrating the incident light into each of 128 tissue samples in the wells.

By measuring 128 wells at a time using parallel CCD acquisition, 1536 depth-resolved motility assays can be performed per hour. The light-source requirements are moderate (1 Watt) for 8 mW per well. The acquisition time is 5 minutes per 128 wells (5×12=1 hour). In the CCD, there are nearly 10,000 pixels per well to provide large statistical sampling for functional OCI. An illustrative well layout in accordance with the teachings of the present invention is shown in FIG. 9. As shown in part in FIG. 10, the illustrative well layout of FIG. 9 is configured such that four rows of 32 wells can be imaged at a time onto the CCD camera through a micro-lens array with 128 molded-plastic lenses. These lenses concentrate the incident light into each of 128 tissue samples in the wells, and as a result, yields nearly 100% efficiency in light usage even with widely-spaced wells and small tissue samples. The reflected light from the tissue is imaged onto a holographic film or directly onto a CCD array to perform the depth sectioning. The number of wells that can be imaged simultaneously is limited only by the light source power. Multiple light sources could be used to increase the number of simultaneous wells to be imaged.

Figure 11:
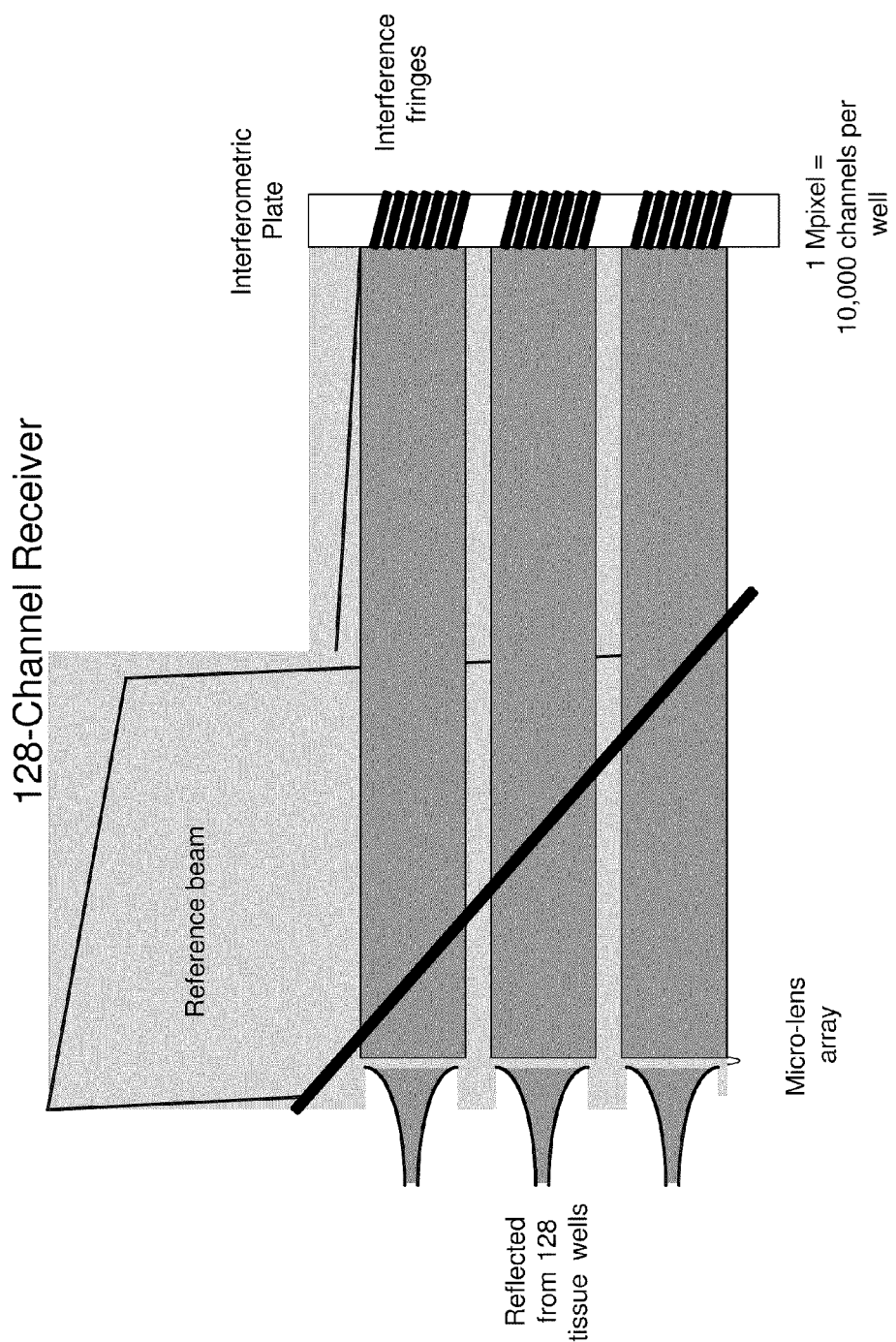
FIG. 11 depicts the introduction of a reference beam to a detector plane for the coherent detection to depth-gate of returned images in accordance with the teachings of the present invention.

The coherent detection to depth-gate the returned images is performed in an interferometric plate, which is either a holographic film or a CCD array. The reference wave can be introduced as shown in FIG. 11. For a 1 Mpixel array, 128 tissue wells at a time can be imaged over a 5 minute period. This is 10,000 channels per well at approximately 1 data set per second for a data size of 300 MB. For a 1536 well plate, this is 3.6 GB per hour, which is within an acceptable range for data storage and analysis.

The biological response of tumors to drugs requires measurements of the response on multiple time scales. The following describes the use of a high frame-rate camera spanning multiple time scales to separate fast from slow motility contributions.

Organelles in high concentration in cells are responsible for much of the light scattering properties of tissue, and organelles can have internal velocities that are an order of magnitude larger than the membrane and hence produce dynamic speckle on the time scale of about 30 to about 300 milliseconds. With the 30 fps camera (described above), these fast dynamics can be captured and hence the system can be sensitive to the full range of physical motions inside the cells and tissues.

With the high time resolution, the fast initial transients to a concentration front (a step function in drug concentration) passing the tumor in the flow cell can be tracked. Multi-exponential response to a concentration front can be captured. This highlights drug transport into the tissue as well as more than one functional response of the cells to the drug. By varying the speed and concentrations of the drugs in the flow cell, and by selecting different known on-rates for different drugs, the time-delay associated with diffusion of the drug through the tissue can be separated from the cellular response to the drug.

Figure 12:
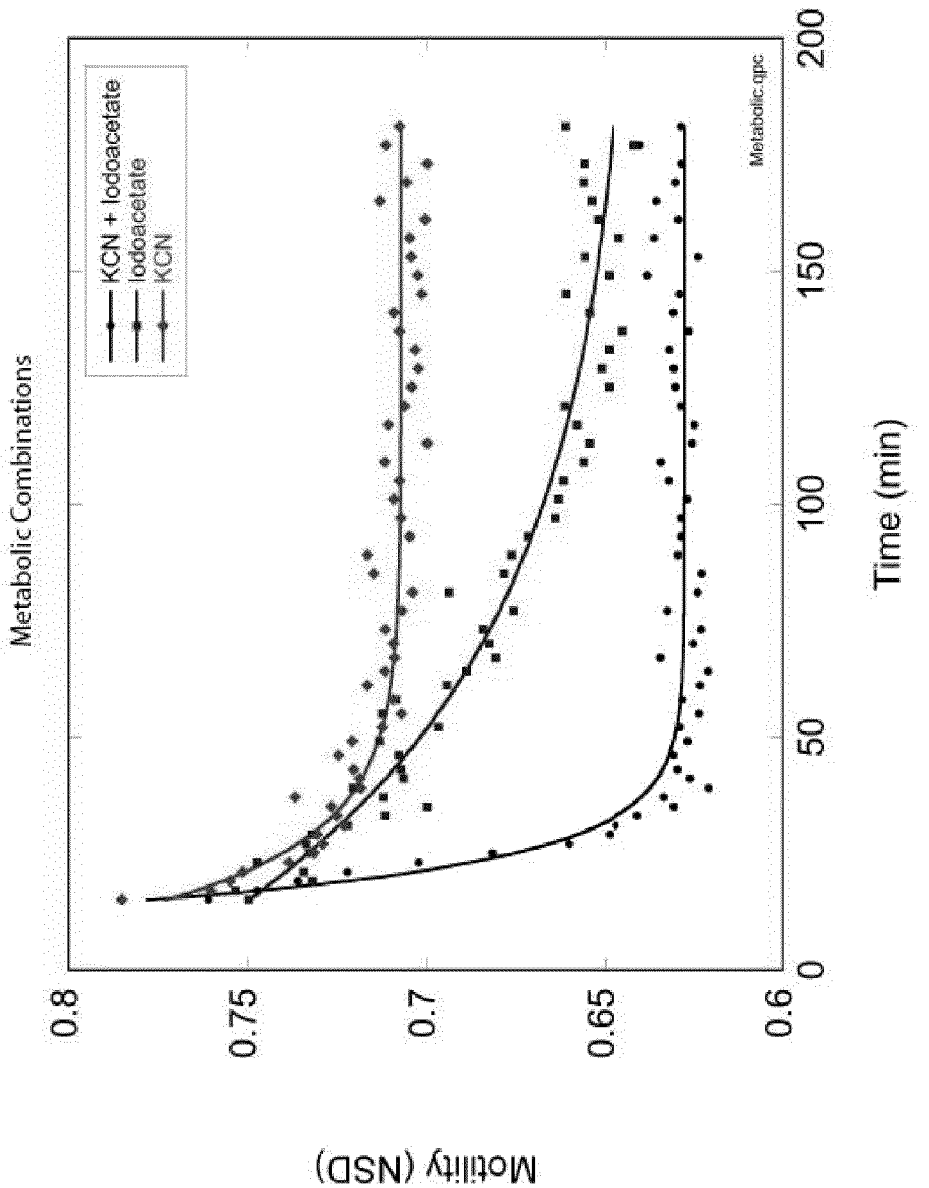
FIG. 12 depicts the combination of metabolic drugs acting on a tumor spheroid.
Figure 13:
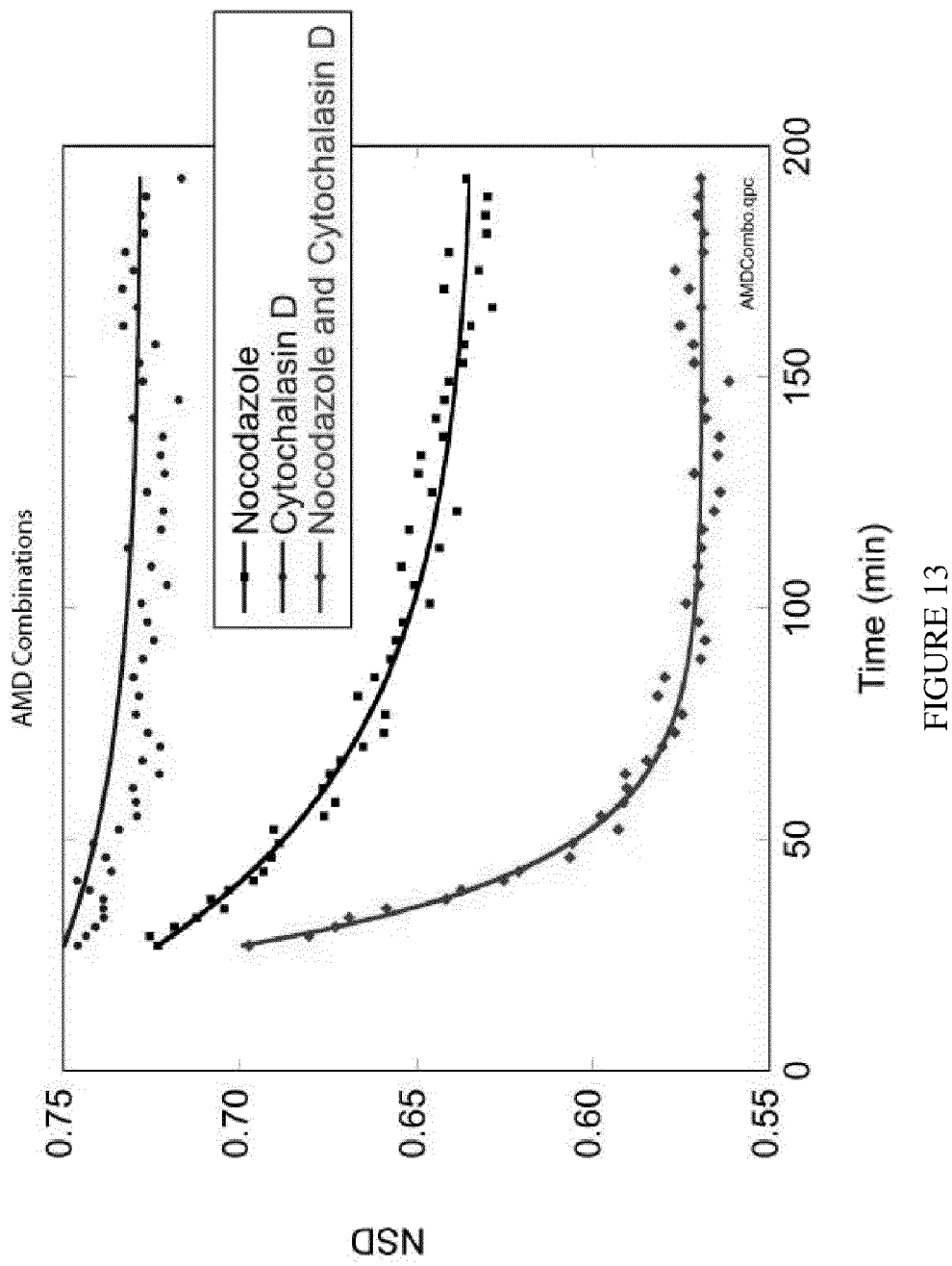
FIG. 13 depicts the combination of microtubule and actin drugs acting on a tumor spheroid.

Multi-component response can be important in the study of drug combinations. Two-component responses have been observed to a combination of cyanide and iodoacetate (that affect oxidative phosphorylation and glycolysis, respectively) in the long-time kinetic response of the tumors. The combination response is shown in FIG. 12. The responses of tumors to combinations of the antimitotic drugs nocodazole and cytochalasin are shown in FIG. 13. The combined effect is synergistic relative to the individual responses. With the high time resolution of the system, the full range of time scales are available for the search for multi-component response of the tissue.

An important aspect of the dose-response curves is the effect that the state of the tumor has on its response to drugs. For instance, a tumor can be hypoxic, or hypothermic, or glucose deficient prior to drug application. This initial state can have an important influence on how the tissue responds. In particular, it can vary how rapidly a cell goes into apoptosis in response to mitotic arrest. Exemplary implementations vary the initial conditions of the tumor by varying oxygen concentration, glucose concentration and temperature of the growth medium and observe the effects on the dose-response curves.

Kinetic curves include both on-rates and off-rates. On-rates indicate how rapidly a drug acts, while off-rates indicate the reversibility of a drug's action. Some drugs are highly non-reversible (colchicine), while others can be highly reversible (colcemid). Many cytoskeletal drug effects are reversible. However, if mitotic arrest lasts too king, then the cell goes into apoptosis, which is not reversible.

On-rates are measured by applying a concentration front in the controlled flow cell and studying the motility responding on different time scales. Off-rates are measured by reapplying the native growth medium and measuring the motility response, again on different time scales. The data from the different time scales provides information on different cellular function (organelles vs. nucleus vs. membrane) and these can be monitored to see how fast they recover after the removal of the drug. The off-rate experiment can also measure the important pharmacological property known as the tissue clearing rate.

As with the dose-response curves, the biological and environmental state of the tumor prior to the application of the drug can be varied to study the dependence of the kinetics on these properties. In addition, different cell lines can be studied to evaluate how generic the kinetic responses are. It should be understood herein that the choice of tissue cell lines in accordance with the teachings of the present invention can be used to highlight different tissue functions.

Drug combinations are often used in modern chemotherapy. The goal of combinations is not just to reduce the concentration of a single drug, but also to apply drugs that have different effects on different cellular functions. MCI can be used for multifunctional imaging based on motility contrast. An exemplary demonstration can use drug combinations that separately affect fast motion (organelles) and slow motion (membrane). By varying the drug concentrations and ratios, the specificity of the motility contrast approach based on different time scales is demonstrated.

Drug combinations also provide a means of mixing cytoskeletal with metabolic drugs. While these combinations are not likely to be used in chemotherapy, they enable the separation of the different contributions of cellular functions to the different motility time scales.

One application is to establish the specificity to different types of motion arising from different types of cellular function. Making this correspondence between function and motility, demonstrates the endogenous multi-functional imaging capability of MCI. There are at least five mechanisms that contribute to motility. These are microtubule and actin polymerization and treadmilling, motor proteins and organelle transport, cell-cell contacts and membrane motion, mitosis, and apoptosis. The following description shows a way to differentiate among these mechanisms.

Microtubules and actin filaments are two dominant components of the cytoskeleton, yet are highly different in structure and function, and hence are enhanced or inhibited by different drugs. This makes the cytoskeletal drugs highly specific in the their targets, which enable separation of the contributions to motility by the microtubules and the actin filaments. The effect of cytoskeletal drugs on motility in different tissues across different time scales can be studied. Examples of cytoskeletal drugs include microtubule stabilizing (colchicine, taxol, discopermolide, epothilone) and microtubule destabilizing (nocodazole, vinblastine, vincristine, colcemid, cryptophycins), actin stabilizing (jasplakinolide) and actin destabilizing (cytochalasin, latrunculin, swinholide, misakinolide, stypoldione, pseudopterolide). Stabilization and destabilization affect motility in different ways, and differently for actin and microtubules, which allows the MCI system to differentiate the different contributions to the observed motility contrast.

Organelles are transported primarily by myosins moving along the microtubules and to a lesser extent by kinesins moving along actin filaments. Drugs that selectively inhibit myosin will primarily affect the organelle motion without large effect on the membrane. Conversely, kinesin inhibitors would be likely to affect the membrane motion more than organelle transport. By applying myosin and kinesin inhibitors separately, combined with motility kinetic measurements on different time scales, the separate contributions by the organelles and by the membrane are confirmed and validated. This shows that the motility contrast has specificity and hence enables the development of an endogenous multi-functional imaging approach. Motor protein inhibitors include myosin poisons (butanedione monoxime, benzyl-tolulene-sulphonamide) and kinesin poison (monastrol). Monastrol is an anticancer drug that inhibits the Eg5 kinesin and prevents cytokinesis at the last stage of mitosis.

Cell-to-cell contacts and cell contacts to the extracellular matrix (ECM) can make contributions to the observed motility contrast, but in a very different way than by the cytoskeleton. These contacts are mediated by adhesion proteins that contribute mechanical stability to tissue as opposed to simply a collection of cells, and they play important roles in intercellular signaling and affect the cell cycle. The adhesion proteins are also novel targets for drugs that are not membrane permeable and hence could not enter the cell. For instance, antibodies against adhesion proteins are available that inhibit their function, degrading the mechanical properties of the tissue and likely influencing the movements of the cell membranes. Inhibition of cellular adhesions can also induce apoptosis. The use of MCI in this context allows not only the study of adhesions in motility contrast, but also the development of an imaging tool that can be useful in the study of the auto-immune disease known as Pemphigus vulgaris in which autoantibodies attack adhesion proteins, leading to severe blistering and ultimately to death if not treated. MCI can also use 3D matrices for tissue growth instead of the tumor spheroids. This further enables the MCI approach to differentiate the roles played by the adhesions in the motility contrast.

Mitosis is a large-amplitude motility event with large displacements of internal structures as well as a complete division of the cell membrane. These events are, however, of low probability, occurring at a rate of only several per second within the full tumor volume. This is a classical situation of non-Gaussian statistics of systems that have large-amplitude events at low probability, leading to high tails on the probability distribution. Because of the statistical nature of dynamic speckle, MCI can investigate the spatial distributions of per-pixel motility values to measure the tail in the probability distribution. From this distribution, MCI is able to isolate pixels that exhibit rare high-amplitude motility changes that are a consequence of mitotic events.

The instantaneous rate of mitotic events can be significantly increased by applying a mild dose of nocodazole for 24 hours to arrest the cell cycle of the proliferating cells at the mitotic checkpoint. When the drug is removed, the cell cycles restart, but nearly all cells are synchronized in their cell cycles and all move into the M-phase nearly simultaneously. This causes a burst of mitotic events within a few hours of the removal of the nocodazole. MCI captures these events as a substantial increase in the measured motility, allowing it to identify the motility fingerprint of mitosis as a separate contribution to overall motility.

A modern generation of anti-mitotic agents is being investigated that act specifically on actively dividing cells, but do not affect the cytoskeletons of non-dividing cells. If effective, these agents could significantly reduce the toxic side effects of chemotherapy. There are three classes of druggable targets for these agents: polo-like kinases (PLK's), kinesin spindle protein (KSP, also known as E5G), and Aurora kinases. The effect of these mitotic-specific drugs on tissue motility can be investigated using MCI. For instance monastrol is a KSP inhibitor, as is Ispinesib which has a much higher affinity for E5G. Because only mitotic cells are affected, these effects can be studied using cell-cycle synchronization.

Another application is the study of the different actions of anti-mitotic drugs (AMDs) on normal relative to transformed (cancerous) cells. There has been recent work to suggest that there are differences in sensitivity to certain cytoskeletal drugs by normal relative to transformed cells, which opens an avenue for studying specificity of AMDs on tissue. The motility response to an AMD could differentiate normal from transformed tissue, representing a new screen for neoplasia.

Apoptosis is the end state of many of the cytoskeletal and motility inhibition drugs. If mitotic arrest lasts too long, or if cellular adhesions are disrupted and not allowed to reform, or if microtubule-associated protein concentrations are altered too far, then apoptosis is induced. The apoptotic response can be dramatic, with increased membrane permeability leading to edema and associated cell shape changes, and increased vesicle traffic as intracellular proteins are degraded by proteases and transported out of the cytosol. Furthermore, even in healthy tumor spheroids, the cells on the inside of the proliferating shell (at the boundary between the shell and the necrotic core) are typically apoptotic because of oxygen and nutrient stress. Even within the necrotic core, there can be high densities of individual or rafts of apoptotic cells.

Figure 14:
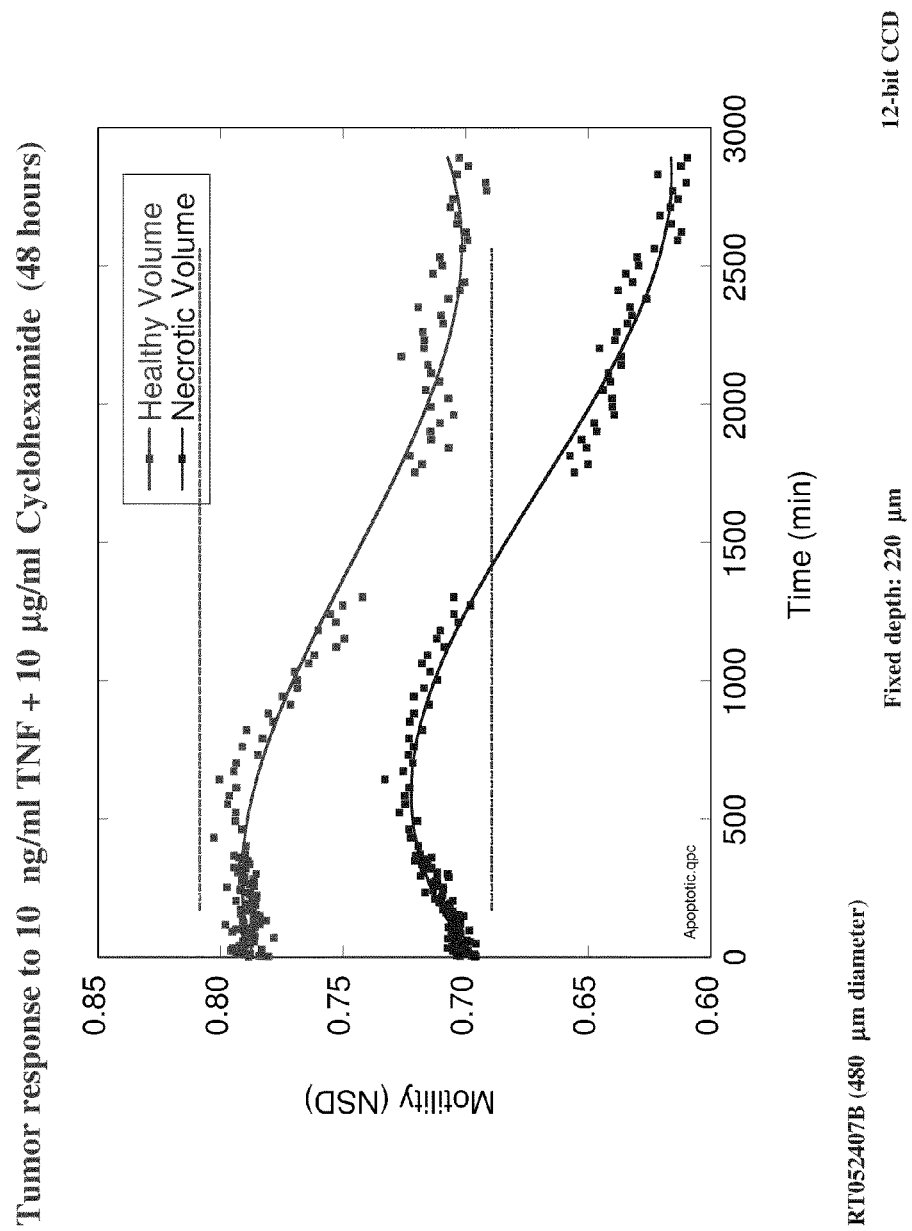
FIG. 14 depicts a graphical representation of an experiment conducted in accordance with the teachings of the present invention and using tumor necrosis factor.

For these reasons, apoptosis can be a component of the motility studies, defining baselines prior to application of drugs, and participating in the end-state motility contrast after drugs are applied. To isolate the apoptotic motility contrast signature, apoptosis-inducing drugs can be applied that induce the cell into apoptosis without directly altering the cytoskeleton. The most common apoptosis-inducing candidate is the cytokine tumor necrosis factor (TNF). An experiment using TNF is shown in FIG. 14 where the upper curve shows the response of the healthy shell and the lower curve shows the response of the necrotic core. The results show an anomalous response in which the motility of the proliferating shell was not altered significantly over several hours, but the motility of the necrotic core increased. This is opposite to the other kinetic response experiments, both metabolic and cytoskeletal, in which the outer shell motility decreased more than the necrotic core. The TNF over the short period of hours has a larger effect on cells already apoptotic or on the verge of being apoptotic than on healthy cells. The higher concentration of apoptotic cells in the core would therefore respond more than in the shell. In the long term, motility in both tissues is suppressed.

MCI can also be used to study the dimensionality-dependent cellular response to cytoskeletal and anti-mitotic drugs by moving continuously from two dimensions to three dimensions. This shows MCI capabilities for application in high-throughput drug testing.

Figure 15:
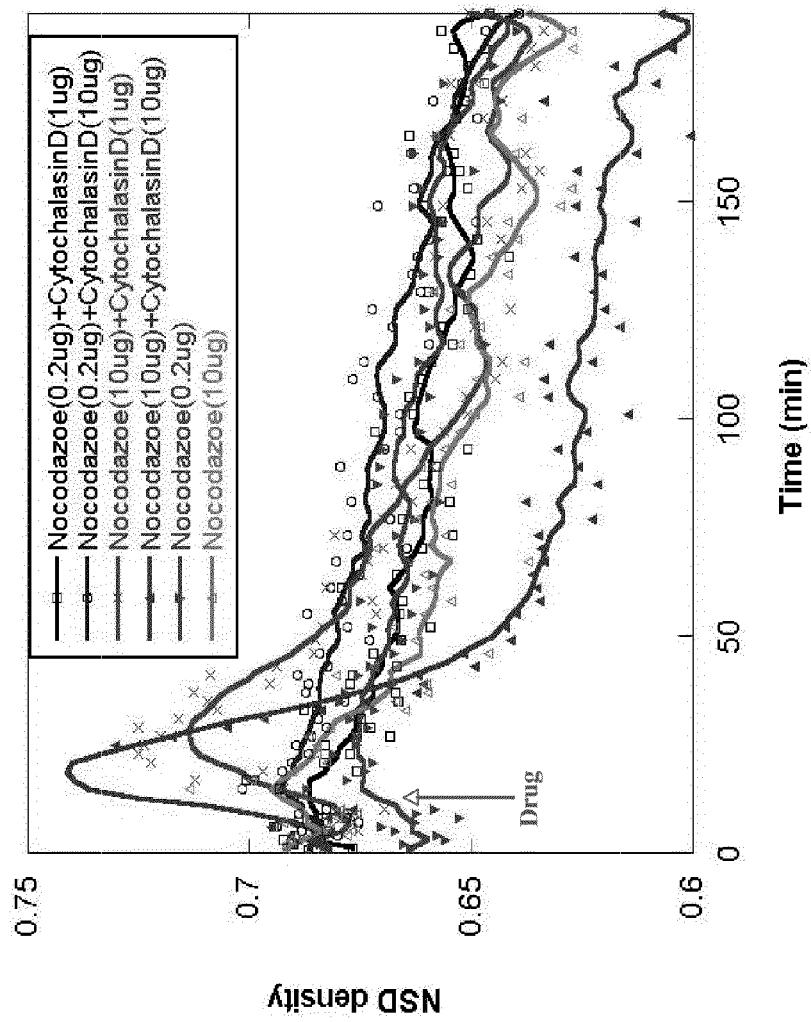
FIG. 15 depicts a graphical representation of a response to combinations of microtubule and actin drugs in tumors attached to plates.

Experiments were performed on tumors allowed to attach to culture plates for periods of 1 to 6 days. The longer attachments produced flatter tissue morphology more closely approximating conventional tissue culture. An overall decrease in motility with the suppression becoming more significant for parts of the tissue closer to the plate was observed. This suggests that the motility is influenced by the membrane, which is dominated by the actin cortex. However, the response of the tissue to microtubule and actin drugs, shown in FIG. 15, remains the same as for the free tumor spheroids. FIG. 15 shows the response to microtubule and actin drugs in tumors attached to plates. The dose response is comparable to that for an unattached tumor, demonstrating the ability of the array format to operate with MCI. Drugs against focal adhesions (on plates) can be important in these studies, which can include antibodies specific to the adhesion molecules such as integrins and cadherins because these proteins are accessible to the outside of the membrane.

Working with quasi-2D tissue (instead of tumor spheroid) that retains 3D behavior can simplify the tissue growth aspects by removing the need for the bioreactor to grow the spheroids.

Figure 16:
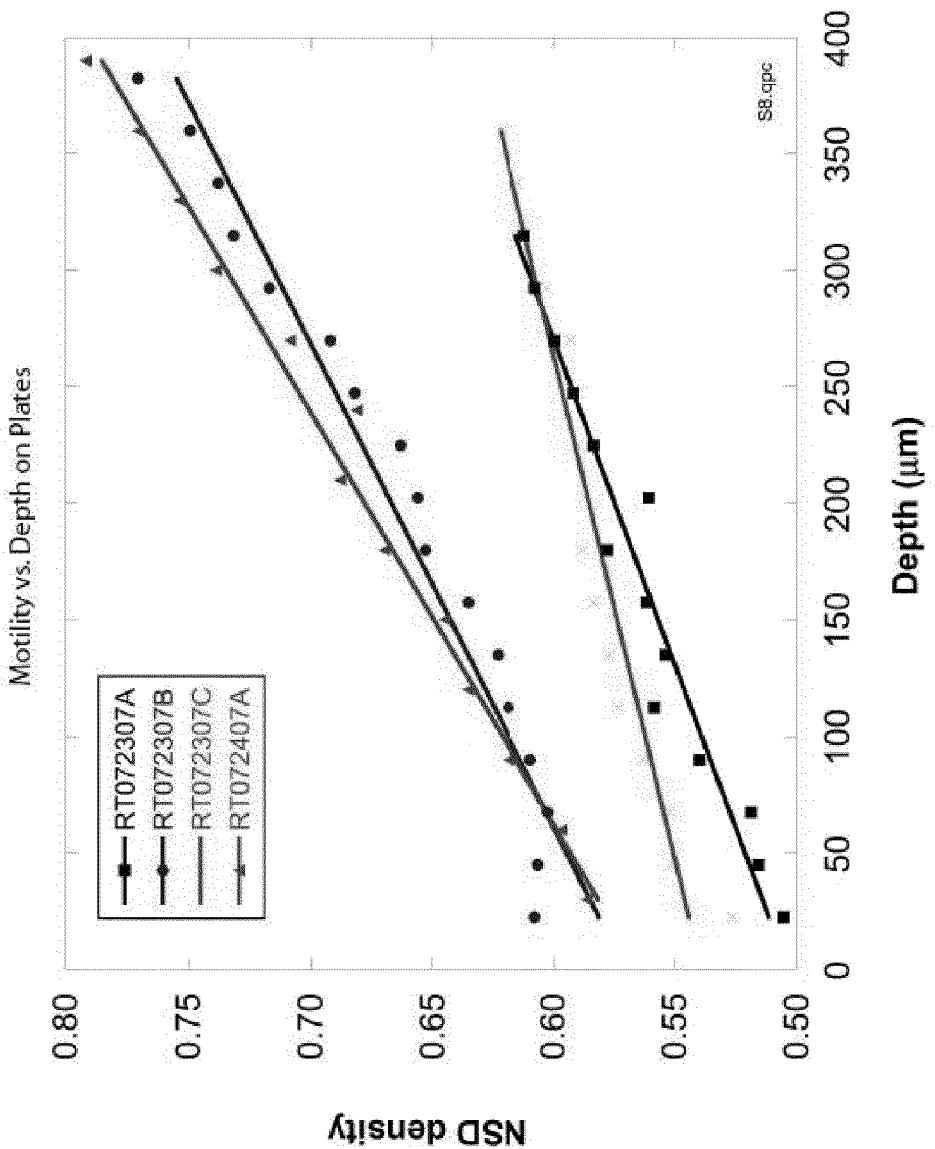
FIG. 16 depicts the increase in motion as a function of distance from the plate surface.

The increased flattening of tumor spheroids with increased attachment time to the plates provides a continuous transition from 3D to 2D. This can be used to study dimensionality effects on motility, and in particular, on mitosis. The division of the cell during cytokinesis represents a large change in the local geometry of tissue, producing local mechanical stresses. These stresses are relieved by changes in the cell-cell adhesions in 3D, but are strongly affected in 2D by focal adhesions to the underlying plate. MCI can study how the dimensionality affects mitosis and how mitosis under reduced dimensionality contributes to the overall motility contrast in MCI: As an example, the motility is shown in FIG. 16 as a function of distance inside the tissue from the plate surface. The motility increases into the normal range observed for 3D tissues for tissue distances greater than about 100 microns.

The ability of cancer cells to move inside of normal tissues is one of the key factors in cancer metastasis. Cancer cells are not inhibited by cell-cell contacts at the adhesions in the way that normal cells are, allowing them to migrate. MCI can investigate whether cell migration in tissue has a signature that can be detected using MCI.

Tumor cells cultured in 3D matrices can be chosen either to enhance or to inhibit cell-ECM contacts. Examples of these matrices include collagen I gels or Matrigel. The 3D cell culture is characterized by a larger number of cell-ECM contacts relative to the cell-cell contacts within tumor spheroids. Drugs and antibodies can be applied against the adhesion proteins, choosing drugs that target specifically cell-ECM or cell-cell adhesions separately. The different responses to these drugs allows MCI to separate the cell-ECM and cell-cell adhesion effects on the motility contrast. Highly motile mammary T1 cancer cells can be introduced into established 3D cell culture of normal mammary S1 cells to distinguish tissues with metastatic migrating cells from normal tissue, which opens the possibility of a new imaging diagnostic for cancer.

The emphasis in this disclosure is on the cytoskeleton, using the unique features of MCI to image actual changes in mechanisms as they occur contrasted to conventional approaches that image the endpoint of a process. But there are many possibilities and alternatives to explore with MCI. MCI is not intended to compete with or replace conventional microscopic motility studies. Conventional microscopy can be used to validate the subcellular pharmacological effects of the drugs. MCI is a macroscale biomedical optical imaging approach that can detect subcellular mechanisms without requiring microscopy.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains.

REFERENCES

The following references are incorporated herein by reference in their entirety:

Bouma, B. E. and G. J. Tearney, eds. Handbook of Optical Coherence Tomography. 2002, Marcel Dekker: New York.

Fujimoto, J. G., Optical coherence tomography for ultrahigh resolution in vivo imaging. Nature Biotechnology, 2003. 21(11): p. 1361-1367.

Fercher, A. F., et al., Optical coherence tomography—principles and applications. Reports on Progress in Physics, 2003. 66(2): p. 239-303.

Schmitt, J. M., Optical coherence tomography (OCT): A review. IEEE Journal of Selected Topics in Quantum Electronics, 1999. 5(4): p. 1205-1215.

Hyde, S. C. W., et al., Sub-100 Micron Depth-Resolved Holographic Imaging Through Scattering Media in the Near-Infrared. Optics Letters, 1995. 20(22): p. 2330-2332.

Hyde, S. C. W., et al., Depth-resolved holography through turbid media using photorefraction. IEEE J. Sel. Top. Quant. Electron., 1996. 2: p. 965.

Jones, R., et al., Holographic storage and high background imaging using photorefractive multiple quantum wells. Appl. Phys. Lett., 1996. 69: p. 1837.

Jones, R., et al., Real-time 3-D holographic imaging using photorefractive media including multiple-quantum-well devices. IEEE J. Sel. Top. Quant. Electron., 1998. 4(2): p. 360-9.

Tziraki, M., et al., Photorefractive Holography for Imaging through turbid media using low coherence light. Appl. Phys. B, 2000. 70: p. 151.

Nolte, D. D., Semi-insulating semiconductor heterostructures: Optoelectronic properties and applications. J. Appl. Phys., 1999. 85: p. 6259.

Nolte, D. D., et al., Adaptive Beam Combining and Interferometry using Photorefractive Quantum Wells. J. Opt. Soc. Am. B, 2001. 18: p. 195-205.

Jeong, K., et al., Fourier-domain holography in photorefractive quantum-well films. Applied Optics, 2004. 43(19): p. 3802-3811.

Jeong, K., et al., Fourier-domain holographic optical coherence imaging of tumor spheroids and mouse eye. Appl. Opt., 2005. 44(10): p. 1798-1806.

Yu, P., et al., Holographic optical coherence imaging of rat osteogenic sarcoma tumor spheroids. Applied Optics, 2004. 43(25): p. 4862-4873.

Yu, P., et al., Time-Dependent Speckle in Holographic Optical Coherence Imaging and the State of Health of Tumor Tissue. Opt. Lett., 2004. 29(1): p. 68-70.

Poon, T. C., T. Yatagai, and W. Juptner, Digital holography—coherent optics of the 21st century: introduction. Applied Optics, 2006. 45(5): p. 821-821.

Schnars, U. and W. P. O. Juptner, Digital recording and numerical reconstruction of holograms. Measurement Science & Technology, 2002. 13(9): p. R85-R101.

de Ridder, L., Autologous confrontation of brain tumor derived spheroids with human dermal spheroids. Anticancer Res., 1997. 17: p. 4119-4120.

Groebe, K. and W. Mueller-Klieser, On the relation between size of necrosis and diameter of tumor spheroids. Int. J. Radiat. Oncol. Biol. Phys., 1996. 34: p. 395-401.

Hamamoto, R., et al., Differentiation and proliferation of primary rat hepatocytes cultured as spheroids. J. Biochem. (Tokyo), 1998. 124: p. 972-979.

Hamilton, G., Multicellular spheroids as an in vitro tumor model. Cancer Lett., 1998. 131: p. 29-34.

Hargrave, P., et al., Optical properties of multicellular tumour spheroids. Phys. Med. Biol., 1996. 41: p. 1067-1072.

Kunz-Schughart, L. A., M. Kreutz, and R. Knuechel, Multicellular spheroids: a three-dimensional in vitro culture system to study tumour biology. Int. J. Exp. Pathol., 1998. 79: p. 1-23.

Kunz-Schughart, L. A., Multicellular tumor spheroids: intermediates between monolayer culture and in vivo tumor. Cell Biology International, 1999. 23(3): p. 157-161.

Tyson, C. A. and J. M. Frazier, eds. In Vitro Toxicity Indicators. Methods in Toxicology. Vol. 1B. 1994, Academic Press.

Mueller-Klieser, W., Biophys. J., 1984. 46: p. 343-348.

Freyer, P., et al., Cancer Research, 1991. 51: p. 3831-3837.

Mueller-Klieser, W., Am. J. Physiol., 1997(273): p. 1109-1123.

Vale, R. D., The molecular motor toolbox for intracellular transport. Cell, 2003. 112(4): p. 467-480.

Vale, R. D. and R. A. Milligan, The way things move: Looking under the hood of molecular motor proteins. Science, 2000. 288(5463): p. 88-95.

Karsenti, E. and I. Vernos, Cell cycle—The mitotic spindle: A self-made machine. Science, 2001. 294(5542): p. 543-547.

Hirokawa, N., Kinesin and dynein superfamily proteins and the mechanism of organelle transport. Science, 1998. 279 (5350): p. 519-526.

Desai, A. and T. J. Mitchison, Microtubule polymerization dynamics. Annual Review Of Cell And Developmental Biology, 1997. 13: p. 83-117.

Peterson, J. R. and T. J. Mitchison, Small molecules, big impact: A history of chemical inhibitors and the cytoskeleton. Chemistry & Biology, 2002. 9(12): p. 1275-1285.

Jordan, M. A. and L. Wilson, Microtubules and actin filaments: dynamic targets for cancer chemotherapy. Current Opinion In Cell Biology, 1998. 10(1): p. 123-130.

Pollard, T. D. and G. G. Borisy, Cellular motility driven by assembly and disassembly of actin filaments. Cell, 2003. 112(4): p. 453-465.

Cukierman, E., et al., Taking cell-matrix adhesions to the third dimension. Science, 2001. 294(5547): p. 1708-1712.

Webb, D. J. and A. F. Horwitz, New dimensions in cell migration. Nat Cell Biol, 2003. 5(8): p. 690.

Moerner, W. E. and D. P. Fromm, Methods of single-molecule fluorescence spectroscopy and microscopy. Review Of Scientific Instruments, 2003. 74(8): p. 3597-3619.

Webb, R. H., Confocal optical microscopy. Reports On Progress In Physics, 1996. 59(3): p. 427-471.

Cahalan, M. D., et al., Two-photon tissue imaging: Seeing the immune system in a fresh light. Nature Reviews Immunology, 2002. 2(11): p. 872-880.

Konig, K., Multiphoton microscopy in life sciences. Journal Of Microscopy-Oxford, 2000. 200: p. 83-104.

Sharpe, J., et al., Optical projection tomography as a tool for 3D microscopy and gene expression studies. Science, 2002. 296(5567): p. 541-545.

Huisken, J., et al., Optical sectioning deep inside live embryos by selective plane illumination microscopy. Science, 2004. 305(5686): p. 1007-1009.

Gustafsson, M. G. L., Nonlinear structured-illumination microscopy: Wide-field fluorescence imaging with theoretically unlimited resolution. Proceedings Of The National Academy Of Sciences Of The United States Of America, 2005. 102(37): p. 13081-13086.

Klar, T. A., et al., Fluorescence microscopy with diffraction resolution barrier broken by stimulated emission. Proceedings Of The National Academy Of Sciences Of The United States Of America, 2000. 97(15): p. 8206-8210.

Cailleau, R. M., et al., Breast tumor cell lines from pleural effusions. J. Natl. Cancer Inst., 1974. 53: p. 661-674.

Kaighn, M. E., Establishment and characterization of a human prostatic carcinoma cell line (PC-3). Invest. Urol., 1979. 17: p. 16-23.

Knowles, B. B., Human hepatocellular carcinoma cell lines secrete the major plasma proteins and hepatitis B surface antigen. Science, 1980. 209: p. 497-499.

Lee, G. Y., et al., Three-dimensional culture models of normal and malignant breast epithelial cells. Nat Methods, 2007. 4: p. 359-65.

Kunz-Schughart, L. A., et al., The use of 3-D cultures for high-throughput screening: The multicellular spheroid model. Journal Of Biomolecular Screening, 2004. 9(4): p. 273-285.

Walenta, S., et al., Metabolic Imaging in Multicellular Spheroids of Oncogene-transfected Fibroblasts. J. Histochemistry and Cytochemistry, 2000. 48: p. 509-522.

Jackson, J. R., et al., Targeted anti-mitotic therapies: can we improve on tubulin agents? Nature Reviews Cancer, 2007. 7(2): p. 107-117.

K. Jeong, J. J. Turek, and D. D. Nolte, "Imaging Motility Contrast in Digital Holography of Tissue Response to Cytoskeletal Anti-cancer Drugs," *Optics Express*, vol. 15, pp. 14057, 2007.

We claim:

1. A system for motility contrast imaging of multiple biological targets, the system comprising:
a multi-well plate having a plurality of wells, each well containing a living biological target;
a micro-lens array with a plurality of lenses corresponding to said plurality of wells, the lens centers oriented to concentrate incident light onto each living biological target contained within each of the plurality of wells;
low-coherence illumination source for generating an incident light beam;
a beam splitter oriented at 45 degrees to the incident light beam for receiving the incident light beam and for producing a multitude of incident beams that illuminate each biological target in each of said plurality of wells, in which the path lengths from the illumination source to each biological target are substantially equal;
a pixel array detector located at the common Fourier plane of the micro-lens array;
a computer-controlled delay stage for zero-path-matching a single reference beam to backscattered object beams, reflected from each biological target in each of said plurality of wells, at the Fourier plane;
a single reference beam that intersects the plurality of backscattered object beams at an angle to produce a series of interference fringes that modulate Fourier-domain information at multiple Fourier regions on the pixel array detector, each Fourier region corresponding to the biological target in each of said plurality of wells; and
a computer for receiving the Fourier-domain information;
wherein the interference fringes between the plurality of backscattered object beams and the reference beam are recorded as a function of time by the pixel array detector and passed to the computer which constructs a time-dependent digital hologram of the biological target within each of said plurality of wells;

and further wherein the computer is configured to control the delay stage to generate said time-dependent digital holograms at successive depths within the biological target within each of said plurality of wells, and to generate a 3D volumetric image from said time-dependent digital holograms at successive depths.

2. The system of claim 1, wherein the illumination source is a mode-locked Ti:sapphire laser having a center wavelength of approximately 840 nm and a bandwidth of approximately 17 nm.

3. The system of claim 1, wherein the illumination source is a superluminescent diode having a center wavelength of approximately 840 nm and a bandwidth of approximately 50 nm.

4. The system of claim 1, further comprising a neutral density filter and a half-wave plate positioned between the illumination source and the beam splitter to control an incident light beam intensity and a beam ratio of the object beam to the single reference beam.

5. The system of claim 1, further comprising a quarter-wave plate positioned between the beam splitter and the biological target to ensure that the backscattered object beam has horizontal polarization after being backscattered by the biological target.

6. The system of claim 1, wherein:
the pixel array detector is a CCD array; and
the spacing of the interference fringes is adjusted to be three times the size of a pixel in the CCD array.

7. The system of claim 1, wherein speckle size of the backscattered object beams is adjusted to be three times the fringe spacing of the interference fringes.

8. The system of claim 1, further comprising a series of lenses for magnifying the object beam.

9. The system of claim 8, wherein at least one of the series of lenses is configured to perform a Fourier transform of the back-scattered object beams at the micro-lens array.

10. The system of claim 1, wherein said multi-well plate includes 128 wells.

11. The system of claim 1, wherein said multi-well plate includes 1536 wells.

* * * * *